United States Patent
Fukushima et al.

(10) Patent No.: US 6,828,892 B1
(45) Date of Patent: Dec. 7, 2004

(54) UNILATERAL MAGNET HAVING A REMOTE UNIFORM FIELD REGION FOR NUCLEAR MAGNETIC RESONANCE

(75) Inventors: Eiichi Fukushima, Albuquerque, NM (US); Jasper A. Jackson, Redwood City, CA (US)

(73) Assignee: New Mexico Resonance, Albuquerque, NM (US)

( * ) Notice: Subject to any disclaimer, the term of this patent is extended or adjusted under 35 U.S.C. 154(b) by 0 days.

(21) Appl. No.: 10/309,451

(22) Filed: Dec. 3, 2002

Related U.S. Application Data

(63) Continuation of application No. 09/307,263, filed on May 6, 1999, now Pat. No. 6,489,872.

(51) Int. Cl.[7] .................................................. H01F 5/00
(52) U.S. Cl. ........................................ 335/299; 335/216
(58) Field of Search ...................... 335/216, 296–301; 318/319–322; 324/318–321

(56) References Cited

U.S. PATENT DOCUMENTS

| | | |
|---|---|---|
| 3,019,383 A | 1/1962 | Varian |
| 3,589,300 A | 6/1971 | Wipf |
| 3,885,504 A | 5/1975 | Baermann |
| 4,350,955 A | 9/1982 | Jackson et al. |
| 4,578,663 A | 3/1986 | Sanders et al. |
| 4,590,427 A | 5/1986 | Fukushima et al. |
| 4,644,313 A | 2/1987 | Miyajima |
| 4,710,713 A | 12/1987 | Strikman |
| 4,717,876 A | 1/1988 | Masi et al. |
| 4,717,877 A | 1/1988 | Taicher et al. |
| 4,719,425 A | 1/1988 | Ettinger |
| 4,721,914 A | 1/1988 | Fukushima et al. |
| 4,727,327 A | 2/1988 | Toyoshima et al. |
| 4,728,896 A | 3/1988 | Bendall et al. |
| 4,784,146 A | 11/1988 | Mancuso et al. |
| 4,812,761 A | 3/1989 | Vaughan, Jr. |
| 4,933,638 A | 6/1990 | Kenyon et al. |
| 4,950,989 A | 8/1990 | Jones |
| 4,984,573 A | 1/1991 | Leunbach |
| 5,022,405 A | 6/1991 | Hok et al. |
| 5,023,554 A | 6/1991 | Cho et al. |
| 5,049,821 A | 9/1991 | Duensing et al. |
| 5,055,788 A | 10/1991 | Kleinberg et al. |
| 5,095,271 A | 3/1992 | Ohkawa |
| 5,162,736 A | 11/1992 | Mansfield et al. |
| 5,291,169 A | 3/1994 | Ige et al. |
| 5,359,310 A | 10/1994 | Pissanetzky |
| 5,382,904 A | 1/1995 | Pissanetzky |
| 5,389,879 A | 2/1995 | Pulyer |
| 5,410,287 A | 4/1995 | Laskaris et al. |
| 5,432,446 A | 7/1995 | MacInnis et al. |
| 5,500,594 A | 3/1996 | Leussler |
| 5,521,571 A | 5/1996 | Laskaris et al. |
| 5,572,132 A | 11/1996 | Pulyer et al. |
| 5,574,417 A | 11/1996 | Dorri et al. |

(List continued on next page.)

FOREIGN PATENT DOCUMENTS

| | | |
|---|---|---|
| GB | 2198540 A | 12/1987 |
| JP | 7-79954 | 3/1995 |

OTHER PUBLICATIONS

Assink, R.A., et al., "A Nondetuning Surface Coil, the Semitoroid*", *Journal of Magnetic Resonance*, 1986, pp. 176–181, vol. 66, Academic Press, Inc. (no month).

Burnett, L.J., et al., "Remote (Inside–Out) NMR. II. Sensitivity of NMR Detection for External Samples*", *Journal of Magnetic Resonance*, 1980, pp. 406–410, vol. 41, Academic Press, Inc. (no month).

Chen, C–N, et al., *Biomedical Magnetic Resonance Technology*, 1989, pp. 147–150, 200–204, Adam Hilger, Bristol and New York. (no month).

(List continued on next page.)

*Primary Examiner*—Lincoln Donovan
(74) *Attorney, Agent, or Firm*—Rod D. Baker

(57) ABSTRACT

A unilateral magnet apparatus having a remote uniform field region. The apparatus' uniform remote field region is suitable for a variety of nuclear magnetic resonance applications.

5 Claims, 15 Drawing Sheets

U.S. PATENT DOCUMENTS

| | | | |
|---|---|---|---|
| H1615 H | | 12/1996 | Leupold |
| 5,629,623 A | | 5/1997 | Sezginer et al. |
| 5,744,960 A | | 4/1998 | Pulyer |
| 5,757,186 A | | 5/1998 | Taicher et al. |
| 5,865,970 A | | 2/1999 | Stelter |
| 5,900,793 A | | 5/1999 | Katznelson et al. |
| 6,476,700 B2 | * | 11/2002 | Schauwecker et al. ...... 335/216 |
| 6,489,872 B1 | * | 12/2002 | Fukushima et al. ......... 335/299 |
| 6,496,091 B2 | * | 12/2002 | Schauwecker et al. ...... 335/216 |
| 6,670,878 B2 | * | 12/2003 | Schauwecker et al. ...... 335/299 |
| 2002/0057155 A1 | * | 5/2002 | Schauwecker et al. ...... 335/299 |

OTHER PUBLICATIONS

Cooper, R.K., et al., "Remote (Inside–Out) NMR.I. Remote Production of a Region of Homogeneous Magnetic Field", *Journal of Magnetic Resonance,* 1980, pp. 400–405, vol. 41, Academic Press, Inc. (no month).

Eidmann, G., et al, "The NMR MOUSE, a Mobile Universal Surface Explorer", *Journal of Magnetic Resonance,* 1996, pp. 104–109, vol. 122, Academic Press, Inc. (no month).

Jackson, J.A., et al., "Remote (Inside–Out) NMR.III. Detection of Nuclear Magnetic Resonance in a Remotely Produced Region of Homogeneous Magnetic Field*", *Journal of Magnetic Resonance,* 1980, pp. 411–421, vol. 41, Academic Press, Inc. (no month).

King, J.D., et al., *Nuclear Magnetic Resonance Techniques for Explosives Detection (U),* Jun., 1975, pp. 77–129, Southwest Research Institute. (no month).

Kleinberg, R.L., et al., "Novel NMR Apparatus for Investigating an External Sample", *Journal of Magnetic Resonance,* 1992, pp. 466–485, vol. 97, Academic Press, Inc. (no month).

Rath, A.R., "Opposed Coil Magnet Calculations for Large Sample and Unilateral Nuclear–Magnetic–Resonance", *Rev. Sci. Instrum.,* Mar., 1985, pp. 402–410, vol. 56, Issue 3, American Institute of Physics.

Semenov, A.G., "'NMR Hydroscope' for water prospecting", *Proceedings of the Seminar on "GEOTOMOGRAPHY",* Dec. 30–31, 1987, Indian Geophysical Union, Hyderabad.

Voss, D., "'New Physics' Finds a Haven at the Patent Office", *Science,* May 21, 1999, pp. 1252–1254, vol. 284.

* cited by examiner

UNILATERAL MAGNET HAVING A REMOTE UNIFORM FIELD REGION FOR NUCLEAR MAGNETIC RESONANCE

CROSS-REFERENCE TO RELATED APPLICATIONS

This application is a continuation of U.S. patent application Ser. No. 09/307,263, entitled "Unilateral Magnet Having a Remote Uniform Field Region", filed on May 6, 1999, and issued as U.S. Pat. No. 6,489,872, the teachings of which are incorporated herein by reference.

BACKGROUND OF THE INVENTION

1. Field of the Invention (Technical Field)

The present invention relates to magnets for nuclear magnetic resonance, more specifically to magnets that generate at least one region with a relatively homogenous magnetic field at a position that is remotely located from the magnet assembly.

2. Background Art

A major use of magnets generating regions of uniform magnetic fields is in magnetic resonance. Nuclear magnetic resonance ("NMR") is a well-established technique with applications fields such as physics, chemistry, mechanical engineering, civil engineering, nuclear engineering, petroleum engineering, food processing, pharmaceutical production, biology, and medicine. Most applications of NMR use a magnet to generate a uniform magnetic field. For superconducting magnets having a cylindrical bore, the uniform field region is within the bore whereas, for resistive electromagnets, the uniform field region is between the magnet's poles. In either configuration, a sample to be studied is confined to a uniform field region that is small compared to a characteristic dimension of the magnet.

Few NMR applications rely on "external" or "remote" uniform field regions in which the objects being examined are positioned to one side or outside of the NMR apparatus. U.S. Pat. No. 3,019,383 ("'383 patent") discloses an early remote apparatus for detecting subsurface liquids, such as water, from a position on the surface while using only the magnetic field of the Earth. A. G. Semenov, M. D. Schirov, A. V. Legchenko, A. I. Burshtein, and A. J. Pusep, further developed this approach in the 1980's (UK Patent Application GB2198540A, "Device for measuring parameters of underground mineral deposits," filed 29 May 1986) with a more practical apparatus. Like the apparatus described in the '383 patent, the apparatus of Semenov et al., does not use a man-made magnet; it relies solely on the NMR signal from protons in subsurface liquids processing in the weak magnetic field of the Earth.

NMR based solely on the Earth's magnetic field inherently yields a low signal-to-noise ratio (S/N), unless the sample size and corresponding number of nuclei are very large. S/N is an essential parameter in NMR; it is directly proportional to the number of atomic nuclei and to approximately the 3/2 power of the magnetic field strength. Stronger magnetic fields align more spins and also make the spins precess faster, which leads to an increase in signal magnitude. NMR applications using the Earth's magnetic field overcome weak magnetic field limitations by examining a very large sample with a correspondingly large number of atomic nuclei. A typical magnet used for NMR has a magnetic field strength that ranges from a fraction of Tesla to tens of Tesla. In contrast, the Earth's magnetic field strength is typically around ½ Gauss —approximately 100,000 times weaker than most commercially available NMR magnets. Applying the 3/2 power criterion to the difference in magnitude between the Earth's field and commercial field magnet strengths equates to an Earth produced signal that is approximately $3 \times 10^7$ less than that of a commercial system for the same sample size. To compensate for the low signal strength, the apparatus of Semenov et al. uses a circular coil having a diameter of 100 meters that is placed on the ground to detect subsurface signals. The volume of the sample thus examined is approximately equal to a hemisphere having a diameter of 50 meters, equivalent to $3.3 \times 10^{10}$ cubic centimeters. When compared to an ordinary laboratory NMR sample of a few cubic centimeters, this represents an increase of $10^{10}$. Such an increase is sufficient to obtain useable signals despite the many adverse conditions of performing in situ environmental NMR.

The aforementioned example demonstrates the difficulty of performing subsurface or otherwise equivalent NMR experiments using Earth's field-based techniques for small sample volumes, such as those encountered when examining shallower depths (less than 50 m) that implies much smaller sample volumes. Therefore, a need exists for a NMR apparatus to perform experiments for remote regions having "mid-range" sample volumes between the "small range" (sub- to a few cubic centimeter dimensions of the laboratory apparatus) and the "large range" (millions of cubic centimeter dimensions of the Earth's field apparatus).

To meet the mid-range need, several classes of remote NMR have been developed that generate a magnetic field that is significantly stronger than the Earth's field. One subclass of such NMR apparatuses comprises magnets that are designed to fit inside holes to observe NMR signals from samples outside the hole. The most common application of this subclass is NMR downhole oil well logging. Early versions of this subclass (as disclosed in U.S. Pat. No. 3,213,357, to Brown) used a NMR logging tool having a coil that was temporarily energized to create a magnetic field in the formation surrounding the bore hole. This field acted to orient, that is, to prepolarize, the spins belonging to the fluid of interest such as oil or water. The nuclear spins of the water around the bore hole were detected as they processed around the Earth's magnetic field immediately after the prepolarization field was turned off. Thus, this method used the applied magnetic field to prepolarize the spins and then used the weaker Earth's field to conduct the remainder of the experiment. The use of the prepolarizing field ameliorates the signal loss at the lower fields from the 3/2 power dependence alluded to earlier; nevertheless, signal loss will still be incurred approximately at the ¾ power of the field strength.

Another scheme emerged in the 1980s, one that placed permanent magnets downhole to generate a magnetic field stronger than the Earth's field as disclosed in U.S. Pat. No. 4,350,955 to Jackson, et al. ("'955 patent"). The '955 patent describes a NMR apparatus with a magnet assembly having two cylindrical permanent magnets aligned along the bore hole axis. The apparatus of the '955 patent projects a thin annular region of substantially uniform magnetic field outside the bore hole. Such schemes use both prepolarization and detection in the presence of magnetic fields stronger than Earth's field, about 0.5 Gauss, which gives rise to much better S/N. The 3/2 power dependence of the signal on the field strength means that even a 5 Gauss field results in a 32-fold gain in S/N whereas a 50 Gauss field yields a factor of 1000 over S/N in the Earth's magnetic field and a 500 Gauss field leads to a gain of more than 30,000. The '955 patent states at col. 2, ll. 64–68; col. 3, ll. 1–11: "A well known requirement for generating an observable NMR signal is a relatively homogeneous magnetic field across a sample volume in order that the precessional frequencies of the nuclei within the sample will be relatively uniform. Previous attempts to "focus" a region of NMR sensitivity into the formation using a non-uniform field (e.g., a magnetic dipole) which decreases rapidly and monotonically with increasing distance from the axis suffer from the fact that the radial width of a sample volume within which the magnetic field homogeneity is good enough to support NMR is extremely small."

U.S. Pat. No. 4,710,713 ("'713 Patent"), entitled "Nuclear Magnet Resonance Sensing Apparatus and Techniques", to Strikman, issued Dec. 1, 1987, is an alternative scheme for bore hole NMR logging. This patent discloses a nuclear magnetic resonance sensing apparatus having one or more magnets to generate a magnetic field in a region remote therefrom. The one or more magnets define a longitudinal axis and the static field created by the magnets has a field direction substantially perpendicular to the longitudinal axis.

U.S. Pat. No. 4,717,876 ("876 Patent"), entitled "NMR Magnet System for Well Logging." to Masi et al., issued Jan. 5, 1988, describes an apparatus that is an improvement to that of the '955 patent. The '876 patent discloses a magnetic structure producing a substantially uniform toroidal field in a region external to the magnetic structure. The first and second order partial derivatives with respect to the spatial coordinates are equal to zero at any selected point within the uniform toroidal field. The magnetic structure comprises at least first magnet means magnetized in a direction extending along a first predetermined axis and a second magnet means magnetized in at least one direction extending at an angle to first said axis. In one embodiment, the first magnet means consists of a pair of elongated magnets. This magnet pair is axially aligned along the first axis but spaced from one another, each of the magnets having an end space defining a predetermined pole. The magnet pair is arranged so that corresponding pole faces are located opposite of each other. The second magnet means of this embodiment consists of a second pair of magnets, wherein each of the magnets is disposed adjacent to the end face of the aforementioned first magnets. The second magnets are magnetized in directions extending radially to the first axis.

U.S. Pat. No. 4,717,877 ("'577 patent"), entitled "Nuclear Magnet Resonance Sensing Apparatus and Techniques" to Taicher et al., issued Jan. 5, 1988, is yet another bore hole NMR patent, generally similar in geometry to the apparatus of the '713 patent. This patent discloses a nuclear magnetic resonance sensing apparatus having one or more magnets to generate a static magnetic field that decays with distance in a region remote therefrom. The one or more magnets define a longitudinal axis and the static field direction is perpendicular to this axis.

U.S. Pat. No. 4,717,878 ("'878 patent"), entitled "Nuclear Magnetic Resonance Sensing Apparatus and Techniques," to Taicher, et al., issued Jan. 5, 1988, is another patent describing a bore hole NMR apparatus, with geometry generally similar to the '713 patent. The '878 patent discloses a nuclear magnetic resonance sensing apparatus having a magnet assembly that includes at least three magnets. The at least three magnets are arranged along a longitudinal axis in side-to-side arrangements and have a generally uniform cross-section which, when joined together, define a circular cross-section. The at least three magnets are magnetized in directions extending perpendicular to the longitudinal axis. At least one of the magnets has a magnetization direction opposite to the magnetization direction of at least one of the other magnets. There are two regions of interest for this geometry comprising two long bar-shaped regions that are located on opposite sides of the bore hole and extended along the bore hole. The '878 patent to Taicher et al. states (col. 6, 11. 3–5) that the disclosed device causes "the one or more magnets to generate a static magnetic field of generally uniform amplitude in a remote region containing materials sought to be analyzed".

U.S. Pat. No. 4,933,638 ("'638 patent"), entitled "Bore Hole Measurement of NMR Characteristics of Earth Formations, and Interpretations Thereof" to Kenyon et al., issued Jun. 12, 1990, and U.S. Pat. No. 5,055,788 ("788 Patent), entitled "Bore Hole Measurement of NMR Characteristics of Earth Formations," to Kleinberg et al., issued Oct. 8, 1991, describe schemes for bore hole well logging. The apparatuses of these patents are designed to produce a static and relatively homogenous magnetic field in a volume adjacent to and on one side of the apparatus. At least two slab-shaped magnets are used to generate the homogenous field that is outside the borehole and extends along one side of it. In several embodiments a third slab-shaped magnet is used that is interposed between the two slab-shaped magnets, in an analogous fashion to the '878 patent. Depending on the desired field characteristics, the polarity of the interposed magnet is aligned with the other two magnets or in opposition to that of the other two magnets. The position of the interposed magnet with respect to the other two magnets is also used to affect the characteristics of the relatively homogenous external field. These patents also disclose a method and apparatus for generating a transverse radio frequency field within the homogenous external static magnetic field volume.

U.S. Pat. No. 5,629,623 ('623 patent"), entitled "Pulse Nuclear Magnetism Tool for Formation Evaluation While Drilling," to Sezginer et al., issued May 13, 1997 is for an apparatus that allows for making NMR measurements while a bore hole is being drilled. This patent discloses a sleeve-shaped tubular magnet that is magnetized transversely to the axis of the drilling tool. The length of the magnet is approximately 2 to 6 feet.

All of the aforementioned methods and apparatuses for bore hole logging are designed to detect protons at a distance of a few centimeters to several centimeters past the edge of the bore hole —the bore hole having typically a diameter of approximately 20 cm.

U.S. Pat. No. 5,572,132 ("'132 patent"), issued Nov. 5, 1996, to Pulyer, et al., discloses an apparatus for biomedical or industrial applications having a magnetic resonance imaging probe that generates its own magnetic field. The probe comprises a primary magnet having a longitudinal axis and an external surface extending in the axial direction. The primary magnet generates a field that provides a region of substantial homogeneity of axial directed field components along the surface and proximate to the surface. In one embodiment, the field is generated by two magnets spaced axially and having axial alignment, wherein the magnetic polarization of each magnet is oriented in the same direction. In another embodiment, the primary magnet is a cylindrical permanent magnet.

U.S. Pat. No. 5,757,186 ("'186 patent"), entitled "Nuclear Magnetic Resonance Well Logging Apparatus and Method Adapted for Measurement While Drilling," to Taicher et al., issued May 26, 1998. This patent discloses a nuclear magnetic resonance sensing apparatus comprising a magnet for inducing a static magnetic field that is radial, rotationally symmetric, and perpendicular to the longitudinal axis of the magnet. In one embodiment, the magnet comprises a plurality of axially magnetized cylinder segments. A particular feature of the axially magnetized cylinders is that the magnetization of each cylinder is proportional in magnitude to its axial distance from the center plane of the magnet. The magnetization of the segments is directed towards the center plane. In an alternative configuration of the magnet, the magnet is constructed from a plurality of radial segments of a cylinder which, when assembled, form a substantially cylindrical annular magnet. In this embodiment, each segment is magnetized radially, along the length perpendicular to the axis of the cylindrical annular magnet.

Unilateral or unidirectional magnets for remote NMR apparatuses comprise another class. Apparatuses of this class are used to examine a sample positioned to one side of the magnet. A distinction is made between unilateral or unidirectional instruments and those NMR apparatuses using magnets that project a magnetic field to only one side of the bore hole (e.g., '638, '788, and '623 patents). Unilateral or unidirectional magnets are designed to work on a planar surface and project a uniform magnetic field region to the other side of the planar surface. Unilateral apparatuses are well suited for NMR applications requiring mobility along a surface. Mobile detection NMR applications in fields and on bridges require use of a portable magnet in conjunction with a NMR excitation and detection coil placed on the surface of the system being studied. Such apparatuses differ from the down-hole concept due to different geometric constraints. In the down-hole geometry, only the length along the bore hole is not severely burdened by geometrical limitations thus the length can be made significantly longer than the bore-diameter. Increasing the length along the bore hole axis acts to elongate the uniform field region rather than increasing the magnetic field strength at a specific uniform field region.

Early applications by Southwest Research Institute, including moisture detection for farm fields, moisture monitoring for drying of concrete, and remote detection of land mines, are reported by J. D. King, W. L. Rollwitz, and G. A. Matzkanin, "Nuclear Magnetic Resonance Techniques for Explosives Detection, Final Report (Contract No. DMK02-74-C-0056) prepared for U.S. Army Mobility Equipment Research and Development Center, Fort Belvoir, Va. 22060, July, 1975. Many of these applications use a main electromagnet in the shape of an upside down "U" with an approximate linear dimension of one meter and a NMR RF "pancake coil" located near the surface of the region of study and in the open part of the "U." The depth of investigation of these apparatuses is limited to few centimeters.

G. Eidmann, R. Savelsberg, P. Blümler, and B. Blümich, "The NMR MOUSE, a Mobile Universal Surface Explorer," J. Magn. Reson. A122, 104–109 (1996) describe a small analog of the above apparatus of King et al., known as "NMR MOUSE," developed by Blümich and collaborators. The magnetic field is made non-uniform in the region of interest in order to isolate a NMR signal from a particular thin shell of nuclear spins; however, this limits S/N.

Some of the aforementioned unilateral NMR apparatuses of King, et al. and the NMR MOUSE apparatus by Eidmann, et al. have magnetic fields, "B." that may have local maxima close to the magnet but then become progressively weaker with respect to increasing distance from the magnet. Such a design allows the operator to choose an appropriate frequency "f" that specifies a surface on which the NMR signal originates, that is, where magnetic field strength obeys the Larmor equation $B=(2\pi/\gamma)f$, where $\gamma$ is the gyromagnetic ratio. For a monotonically decreasing magnetic field, the Larmor equation is satisfied only within a thin shell. If the bandwidth of the RF pulse in NMR is approximately 1 kHz or less, the shell, in which the NMR signals originate, spans field values that differ only by 0.25 G for protons. If the field drops from 5000 G to zero over 5 meters, the average gradient is 10 G/cm so the shell is only approximately 0.25 mm thick, assuming a 1 kHz RF pulse. In this particular scheme without a uniform field region, a NMR signal arises from an oddly shaped "spin resonant" shell.

King et al. (1975) also discloses designs for multiple magnet element assemblies that project a uniform field to one side. One such design consists of two identical circular loops of wire coaxially displaced from each other and carrying electrical currents in opposite directions. The magnetic fields from the two loops cancel differently at different distances along the cylindrical axis and result in a substantially uniform field region on axis just outside each loop. Thus, the major benefit of a uniform field region, a sweet spot, is to provide a well-defined sensitive volume rather than a thin shell from which NMR signals can be obtained.

Another scheme by King et al. (1975) is a pair of coplanar rectangular loops, parallel to each other and spaced apart by approximately a loop dimension. When equal but opposite currents flow in the two side-by-side loops, the magnetic field at points on a perpendicular bisector of the space between the coplanar loops is parallel to the plane and exhibits a maximum as a function of the distance away from the plane, i.e. there will be a region of substantially uniform field at some distance from the plane. In both of these examples from King, et al. (1975), the distance to the position of substantially uniform field is a small fraction of the extent of the magnet in the direction perpendicular to the projection direction.

U.S. Pat. No. 4,721,914 ("'914 Patent"), entitled "Apparatus for Unilateral Generation of a Homogenous Magnetic Field," to Fukushima et al., issued Jan. 26, 1988, discloses an apparatus for generating a homogenous static magnetic field by two circular electromagnetic coils. The currents in the coils are in opposition so that the resulting magnetic fields subtract. In all embodiments the radius of the fore coil is smaller than the radius of the aft coil. The design of the two coils provides that for a homogenous static field region external to the coil wherein both the first and second derivatives of the field with respect to the coil axis are nulled.

U.S. Pat. No. 5,095,271 ("'271 Patent"), entitled "Compact Open NMR System for In Situ Measurement of Moisture, Salinity, and Hydrocarbons," to Ohkawa, issued Mar. 10, 1992, discloses a nuclear magnetic resonance device having a cylindrical magnet that has a plurality of south poles and an equal plurality of north poles, the poles being dimensioned and disposed on the magnet to establish a toroidal zone external to the magnet wherein the field of the magnet is of substantially constant strength. The direction of the field is orthogonal to the cylinder axis and the uniform field region is located radially from the center of the magnet.

U.S. Pat. No. 5,382,904 ("'904 patent"), entitled "Structured Coil Electromagnets for Magnetic Resonance Imaging and Method for Fabricating the Same," to Pissanetzky, issued Jan. 17, 1995, discloses electromagnets suitable for use in NMR imaging that are constructed according to a structured coil methodology. The magnet construction results in a plurality of coils of varying current polarities and of irregular shape and size that are optimized to provide a uniform field. The uniform field is located internal to the coil structure or optionally outside the location of the coils. The electromagnets developed according to this method comprise at least one coil, wherein the current conducted at a plurality of locations therewithin is determined by the method. In several embodiments the magnet comprises coil assemblies having several individual coils carrying currents in clockwise and counter-clockwise directions. In at least one embodiment, pairs of such coil assemblies are used. All embodiments envisage the use of superconducting electromagnets. In a typical embodiment of a remote NNR magnet, a superconducting winding of radius 125 cm and thickness 80 cm projects a uniform field region (to 10 ppm) that is a 10 cm radius sphere whose center is 15 cm from the nearest coil. The magnet shall have six separate coil windings within the dimensions given and the average current density required to project a ½ Tesla field in the uniform field region is 1700 A/m². The '904 patent to Pissanetzky states (col. 1, 11. 37–40) "The volume of the subject to be imaged (i.e., the volume of interest, or 'VOI') is that volume which receives the high DC magnetic field, and within which the DC field is substantially uniform." The '904 patent also states: "it is highly desirable to provide NMR tomography equipment of the minimum size but with adequate field strength and uniformity" (col. 3, 11. 32–34), "t is an object of the present invention to provide a method of fabricating an electromagnet for optimizing the field strength and uniformity in a selected volume of interest" (col. 4, 11. 55–58); and "the present invention is directed to superconducting magnets, and methods of fabricating the same, capable of providing high uniformity magnetic fields within a volume of interest as is useful in magnetic resonance imaging NMR" (col. 6, 11. 40–44); "n this example, magnet 2 is capable of generating a suitably high DC magnetic field, such as on the order of 5 kgauss, with high uniformity (10 ppm or less deviation) over a spherical VOI of diameter on the order of 20 cm, and centered approximately 10 cm above the top surface of the coils of magnet 2" (col. 8, 11. 13–20), and the "field strength of magnet 20 is contemplated to be on the order of 10 kgauss (1.0 Tesla), substantially uniform (<10 ppm) over the VOI of on the order of 10 cm in diameter" (col. 16, 11. 13–16.

U.S. Pat. No. 5,744,960 ("'960 Patent"), entitled "Planer Open Magnet MRI System," to Pulyer, issued Apr. 28, 1998, also discloses a magnetic resonance imaging system having an open magnet structure. The open magnet structure has a primary magnet with two primary pole pieces connected by a primary ferromagnetic core for creating an internal flux. A bias magnet having polarity opposite to the primary magnet is located between the two primary pole pieces. Superposition of the magnetic fields of the primary magnet and the bias magnet provide for a relatively homogenous field external to the primary and bias magnets.

In summary, the present state of art consists of several distinct classes of NMR apparatuses. One class consists of conventional magnets having useable field regions that are bounded or surrounded by the magnet components and not external to it. The second class is that of remote or external magnets in which the useful magnetic field is located outside the magnet assembly. There are two subclasses of such remote magnets. In the first subclass, there is no substantially uniform field region that is useful. The second subclass of remote magnets consists of magnets that have substantially uniform field regions.

Yet another geometrical classification within the external or remote magnet class comprises external or remote magnets that are intended to work inside a hole such as a geological bore hole or inside a vessel in an intact animal. One group of these magnets projects a useful magnetic field omni-directionally in at least in two directions outside the hole or vessel while another group projects the useful field primarily in a single direction.

SUMMARY OF THE INVENTION
(DISCLOSURE OF THE INVENTION)

The present invention is of a magnetic field generating apparatus having a body with a substantially annular cross-section. The body of this embodiment has at least one diameter, a longitudinal axis and a finite length. The body comprises a magnet system for producing a substantially uniform magnetic field in a region external to the body. In this preferred embodiment, the uniform field region is substantially centered on the longitudinal axis and positioned at a distance of at least 0.15 times a largest of the body's diameters from the body. The magnet system of this preferred embodiment comprises electronic magnets and/or permanent magnets. Commercially available permanent magnets comprise a variety of shapes and sizes. A plurality of individual permanent magnets is suitable for creating the magnet system. Individual permanent magnets are configurable in a variety of configurations, including, but not limited to, a plurality of permanent magnets forming a stack. A plurality of magnet stacks is positionable in a body to form a magnet system. This particular embodiment of the present invention, when the magnet system comprises permanent magnets, uses a plurality of magnet stacks configured in a body to form a substantially annular magnet system. In this preferred embodiment, annular refers generally to the overall configuration of the apparatus whether or not the body comprises a continuous annulus or a discontinuous annulus. In any instance, placement of at least one annular steel end piece onto the body generally acts to enhance the magnet system azimuthal field homogeneity. The magnet system of this embodiment is shortable by addition of shorting means comprising, but not limited to, ferromagnetic annular cylinders and ferromagnetic cylinders. Such shorting means are placed concentrically to the magnet body, either internally or externally. This embodiment comprises part of a NMR device through addition of a coil system for producing an oscillating magnetic field substantially transverse to the uniform magnetic field. Such a coil system is useable either alone or in conjunction with addition of a coil system for producing a rotating magnetic field substantially transverse to the uniform magnetic field. The coil system for producing a rotating magnetic field is useable either alone or in conjunction with a coil system for producing an oscillating magnetic field. Such coil systems are also useful for detection of electromagnetic radiation.

The present invention is also of a magnetic field generating apparatus comprising at least two concentric bodies having substantially annular cross-sections, each having at least one diameter and all having a substantially common longitudinal axis. These bodies have finite lengths. The bodies also have magnet systems for producing a substantially uniform magnetic field in a region external to the bodies and substantially centered on the longitudinal axis. The substantially uniform field region is positioned at a distance of at least 0.15 times a largest of the diameters from the bodies. Variations of the magnet system and shorting means of the aforementioned embodiment also apply to this particular embodiment. Such variations include, but are not limited to, magnet systems comprising electronic magnets and/or permanent magnets. A particular variation of this embodiment comprises means for moving at least one of the concentric bodies relative to another of the concentric bodies. Such means allow for adjustability of characteristics of the substantially uniform field region. Another particular variation of this embodiment features at least one of electronic magnet and current adjustment means for adjusting current of the at least one electronic magnet system. This variation, as other variations, is useful in conjunction with other variations of this embodiment and other embodiments of the present invention. This particular embodiment comprises part of a NMR device through addition of a coil system for producing an oscillating magnetic field substantially transverse to the uniform magnetic field. Such a coil system is useable either alone or in conjunction with addition of a coil system for producing a rotating magnetic field substantially transverse to the uniform magnetic field. The coil system for producing a rotating magnetic field is useable either alone or in conjunction with a coil system for producing an oscillating magnetic field. Such coil systems are also useful for detection of electromagnetic radiation.

The present invention is further of a magnetic field generating apparatus comprising a body having a substantially annular cross-section having at least one diameter and a longitudinal axis. The body also comprises a finite length. Additionally, this embodiment comprises a first magnet system for producing a substantially uniform magnetic field in a region external to the body and substantially centered on the longitudinal axis and a second magnet system comprising a cylinder substantially positioned on the longitudinal axis. Positioning of the cylinder along the longitudinal axis alters the substantially uniform magnetic field. Variations of the magnet system and shorting means of aforementioned embodiments also apply to this particular embodiment. Such variations include, but are not limited to, magnet systems comprising electronic magnets and/or permanent magnets. In this particular embodiment, a second magnet system comprises a magnet direction parallel to the first magnet system or anti-parallel to the first magnet system. This embodiment comprises part of a NMR device through addition of a coil system for producing an oscillating magnetic field substantially transverse to the uniform magnetic field. Such a coil system is useable either alone or in conjunction with addition of a coil system for producing a rotating magnetic field substantially transverse to the uniform magnetic field. The coil system for producing a rotating magnetic field is useable either alone or in conjunction with a coil system for producing an oscillating magnetic field. Such coil systems are also useful for detection of electromagnetic radiation.

The present invention is additionally of a magnetic field generating apparatus comprising at least two bodies having substantially annular cross-sections, each having at least one diameter and all having a substantially common longitudinal axis. The bodies also have finite lengths. This embodiment further comprises magnet systems for producing at least one substantially uniform magnetic field in a region external to the bodies and substantially centered on the longitudinal axis. In this embodiment, the at least one substantially uniform field region is substantially centered between the at least two bodies which are separated by a distance of at least 0.15 times a largest of said diameters. Variations of the magnet system and shorting means of aforementioned embodiments also apply to this particular embodiment. Such variations include, but are not limited to, magnet systems comprising electronic magnets and/or permanent magnets. This particular embodiment comprises part of a NMR device through addition of a coil system for producing an oscillating magnetic field substantially transverse to the uniform magnetic field. Such a coil system is useable either alone or in conjunction with addition of a coil system for producing a rotating magnetic field substantially transverse to the uniform magnetic field. The coil system for producing a rotating magnetic field is useable either alone or in conjunction with a coil system for producing an oscillating magnetic field. Such coil systems are also useful for detection of electromagnetic radiation.

Aforementioned embodiments and variations thereof comprise part of a NMR device when appropriately equipped as described herein. When apparatuses of the present invention are used as a NMR device the present invention also comprises an inventive method of nuclear magnetic resonance. The invention when used for NMR, is useful for measuring NMR signals from all known nuclei having magnetic resonance properties, including, but not limited to, isotopes of hydrogen, nitrogen, carbon, fluorine, oxygen, phosphorous, sulfur, and chlorine.

The present invention is also of a method comprising: introducing a body proximate to a volume of interest, the body comprising an annular cross-section having a longitudinal axis substantially collinear with the volume of interest, a finite length, and a magnet system for producing a substantially uniform magnetic field in the volume of interest; producing at least one magnetic field component substantially transverse to the uniform magnetic field wherein the at least one magnetic field component is selected from a member of the group consisting of oscillating magnetic field and rotating magnetic field; and measuring an electromagnetic response from the volume of interest. The method is useful with aforementioned apparatus embodiments and variations thereof. The method can also incorporate a producing step that defines a region within the volume of interest wherein the measuring step measures an electromagnetic response from the defined region within the volume of interest. When defining a region within a substantially uniform field, the producing step for defining a region within the volume of interest comprises producing a first magnetic field component substantially transverse to the uniform magnetic field and producing a second magnetic field component substantially transverse to the uniform magnetic field wherein the first magnetic field component spatially differs from the second magnetic field component. For NMR applications, the aforementioned first and second magnetic field components vary with time. In other NMR applications, at least one additional magnetic field is used to provide, for example, a magnetic field gradient in the uniform field region. In some NMR applications, such at least one additional magnetic field varies with time. In a preferred embodiment of the method, the first magnetic field component is substantially orthogonal to the second magnetic field component. Generally, the first magnetic field comprises a field distribution substantially different than that of the second magnetic field.

The methods and/or apparatuses of the present invention are useful for examining a volume of interest that is subterranean, a biological material, and/or a building material. For example, the methods and apparatuses of the present invention are useful when the volume of interest lies within an animal, a plant, the Earth, a building, a road, an airport runway, a statue, a pillar, a commercial good, and/or a food where such food is, for instance, a fruit. The methods and apparatuses of the present invention is useful for detecting NMR signals from these materials as well as others. These examples are, of course, not exhaustive of the usefulness of the present invention because other uses exist in physics, chemistry, mechanical engineering, civil engineering, nuclear engineering, petroleum engineering, food processing, pharmaceutical production, biology, medicine, and allied fields. Furthermore, the methods and/or apparatuses are useful for examining a volume of interest wherein a partition lies between the volume of interest and the body.

Accordingly, a primary object of the present invention is to project a region of substantially uniform magnetic field in a specific direction at some distance from a magnetic body. In a preferred embodiment of the present invention, a permanent magnet serves as the magnetic body and comprises a right circular hollow cylinder with one end of the cylinder being a north magnetic pole and other end being south magnetic pole. The uniform magnetic field region of this preferred embodiment lies at a local maximum of the field that is located along a cylinder axis of the magnetic body, or magnet. There is a relationship between the relative distance from the magnet to the uniform field region versus the intensity of the magnetic field at the uniform field region. With currently available magnetic materials such as neodymium iron boron (NdFeB), a magnetic field intensity of the order of several hundred Gauss is obtainable at a uniform field region and local maximum that is at a distance approximately equal to the radius of the magnet beyond the end of the magnet.

A primary advantage of the present invention over the prior art is that the distance to the uniform field region in relation to the transverse dimension of the magnet is significantly larger, in other words, the present invention achieves a large aspect ratio, defined as the ratio of the distance to the uniform field region to the magnet's cross-sectional distance, when compared to prior art.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating the principles of the invention and are not to be construed as limiting the invention. In the drawings.

DESCRIPTION OF THE PREFERRED EMBODIMENTS

BEST MODES FOR CARRYING OUT THE INVENTION

The present invention meets the need for a magnet that projects a uniform magnetic field region to a position on one side of the magnet. The present invention comprises part of a unilateral device, for example, a NMR apparatus to examine objects that cannot be otherwise accessible because of size or for other limiting reasons. In addition, use of two units of the present invention forms a magnet having a relatively open architecture compared to traditional gapped or solenoidal magnets.

The present invention comprises an efficient magnet which produces a region of uniform magnetic field that is to one side of the magnet and not between components of the magnet. The present invention comprises one or more permanent magnets and/or electromagnets to form a uniform region at a greater relative distance from the nearest magnet part. An aspect ratio defined by the distance to the uniform region and the magnet's cross section characterizes this particular advantage. Magnets of the present invention accomplish the foregoing with greater simplicity and lower cost than existing systems.

The ability to provide a uniform magnetic field in a given region is desirable in many applications. Magnetic resonance is only one of many applications and is instructive in illustration of some applications of the present invention, such as for use in glove box NMR, medical NMR, veterinary NMR and subsurface NMR. However, the usefulness of the present invention is not limited to magnetic resonance or NMR.

Figure 1:
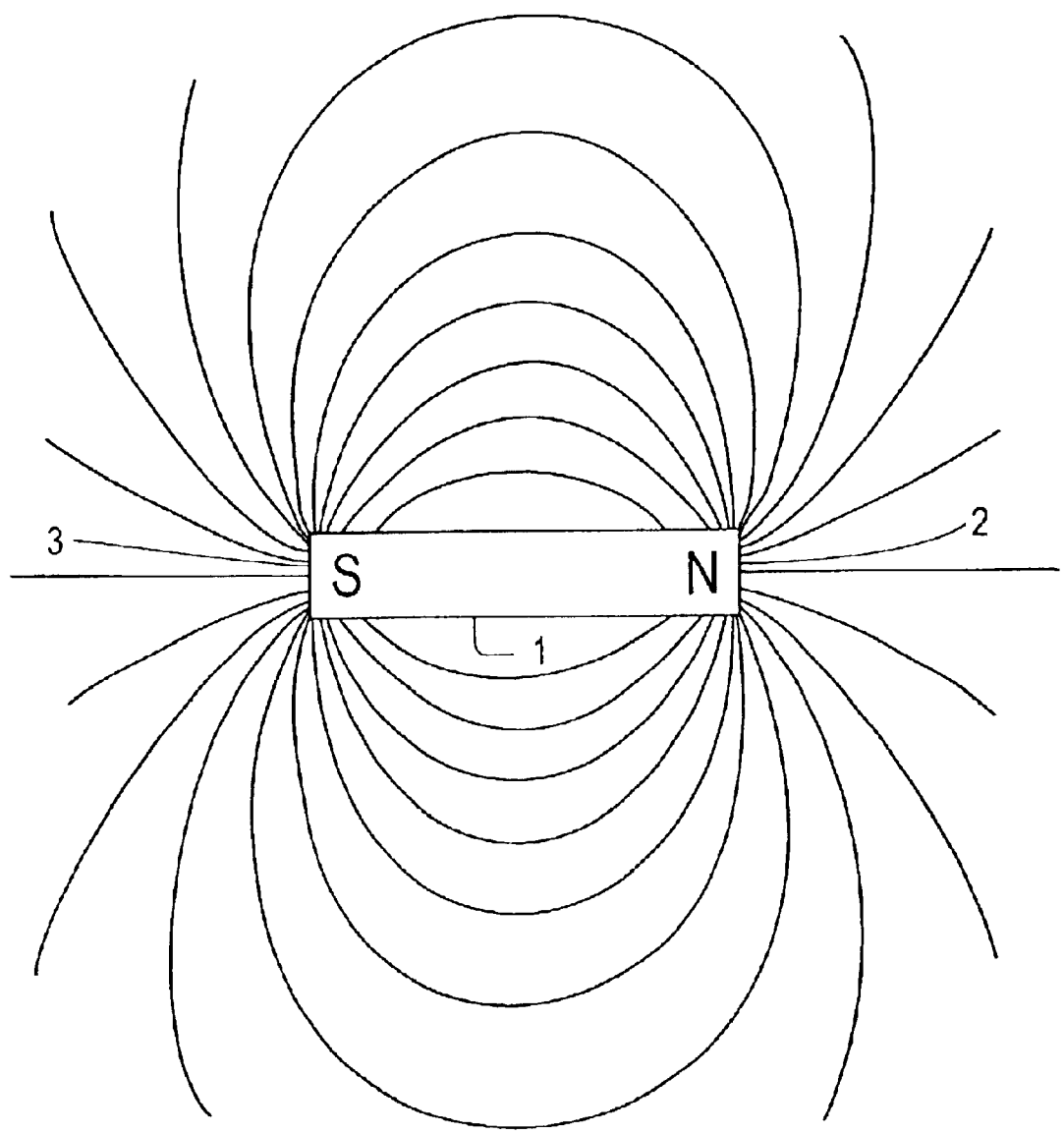
FIG. 1 is an illustration of the magnetic field lines of a straight bar magnet, showing that magnetic field lines diverge away from the ends.

In preferred embodiments of the present invention, permanent magnets are used; in other embodiments of the present invention electromagnets are suitable. To better understand magnets of the present invention, consider a conventional cylindrical bar magnet 1 with one end 2 being a north pole and the other end 3 a south pole as shown in FIG. 1. The magnetic constant field lines generated by such a bar magnet diverge with respect to an increase in distance along the axis as they emanate from the north pole. These field lines re-converge at the other end as they enter the south pole. For purposes of this disclosure, the description of field lines at north and south poles are equivalent but are chosen as emanating from the north pole and entering the south pole to serve as a point of reference for discussion. The pertinent consideration for discussion of the present invention is that magnetic field strength is proportional to the density of the field lines. Thus, when the field lines diverge, for example, with respect to increasing axial distance from the ends of the bar magnet, the magnetic field strength decreases.

Figure 2:
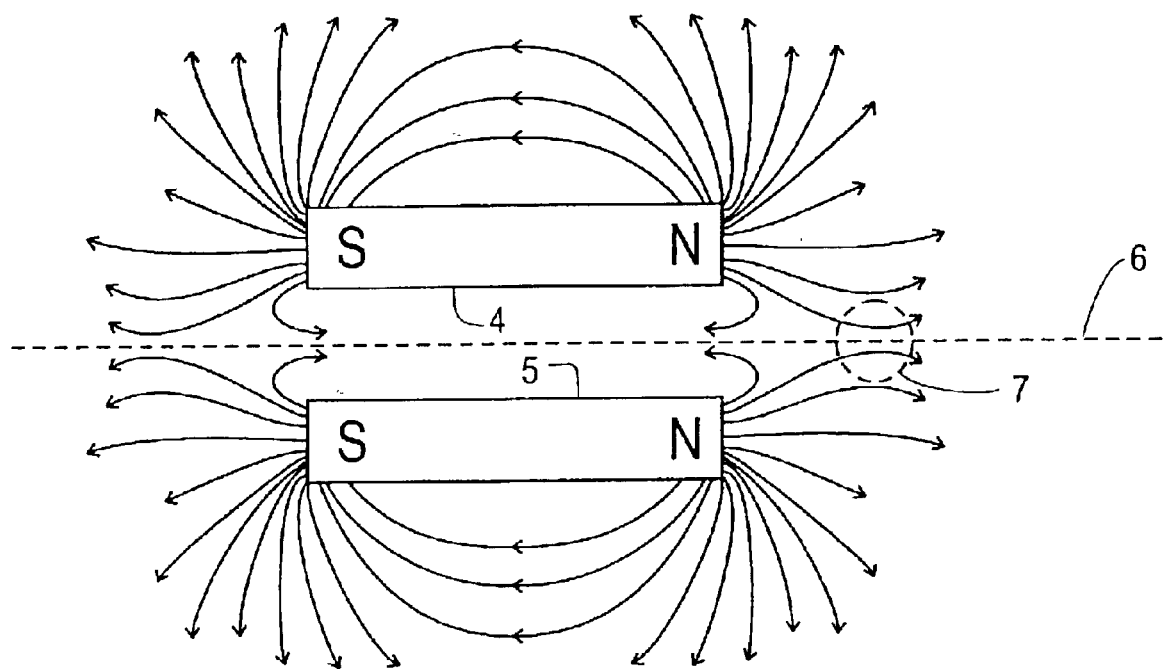
FIG. 2 is an illustration of the magnetic field lines of two parallel and identical bar magnets showing that the field lines converge on the symmetry axis at some distance from the ends of the magnets.

Consider two identical bar magnets 4 and 5, parallel to each other with identical magnetic polarization direction, as shown in FIG. 2. At distances very remote from the magnet pair, measured in units of magnet separation, the magnetic field will approximately assume the form generated by a single bar magnet with twice the magnetization strength as that of a single bar magnet. On the other hand, for distances much smaller than the separation distance, the field lines will approximate those emanating from two separate bar magnets.

The intermediate situation, where distances of interest are approximately of the order of the spacing between the magnets, is the case of interest for a preferred embodiment of the present invention because the behavior of the field lines is directly affected by the presence of the two separate magnets. Consider the magnetic field along the symmetry axis 6 from the center of the magnet to distances large compared to the magnet assembly. Because of symmetry, the magnetic field has only an axial component along this axis 6 and it generally decreases with increasing distance from the magnets but undergoes a fairly complex change as a function of distance from the magnet. Specifically, the magnetic field is strongest between the magnets and becomes weaker with respect to distance from the center of the two magnets. Eventually, the field produced by the magnets becomes zero, or null, at a relatively short distance from the magnets' ends where it reverses direction and reaches a relative maximum 7 at some distance past the null before decaying to zero at greater distances. This relative maximum is a saddle point with both the axial and the radial slopes of the field intensity equal to zero. Thus, this region of substantially uniform field, called the sweet spot, is suitable for generating NMR signals.

This general magnet form is part of the present invention and serves as a basis for preferred embodiments of the present invention. The present invention starts with a pair of bar magnets that projects a sweet spot along an axis at some distance away from the magnet ends and adds additional magnet elements to increase magnetic field strength at the sweet spot without substantially moving or enlarging the sweet spot with respect to the body of the magnet. A description for arranging a plurality of magnets according to the present invention follows.

The present invention comprises magnet elements located in defined and preferential patterns. Specifically, in the preferred embodiments of the present invention, magnet elements have either pair-wise or rotational symmetry about an axis with all magnetic elements having their magnetic orientation in the same direction along that axis. The following examples of geometric arrangement of magnets demonstrate preferred embodiments of the present invention. First, consider a pair of magnets equidistant from an axis and positioned relative to each other by a 180° rotation or a reflection operation. In the simplest form, there are two identical bar magnets, as already described and shown in FIG. 2, that are substantially parallel to each other and located at the same radial distance and axial location. In a preferred embodiment, two magnets arranged in such a fashion are not parallel but converge or diverge while still maintaining reflection symmetry about the axis. Similarly, a preferred embodiment comprises magnet elements that do not have uniform cross-section but, for example, are thicker at one end. Similarly, a preferred embodiment comprises or magnet elements that are not straight but curved.

A preferred embodiment of the present example extends the single pair of magnets to a plurality of magnet pairs numbering greater than one. In this particular preferred embodiment, pairs of magnets are placed around an axis of symmetry, all at substantially the same radial distance and axial coordinates. In this preferred embodiment, angular spacing of the magnet pairs relative to each other is variable, provided that each pair obeys the reflection symmetry. For example, in one preferred embodiment, two pairs of magnets are placed so that the first pair has magnets at 0 and 180 degrees while the second pair of magnets are at 60 and 240 degrees or 13 and 193 degrees and so on, around the axis. Of course, this preferred embodiment includes, as a special case, pairs of magnets that are azimuthally displaced evenly with respect to other pairs so, for example, four identical magnets could be located 90 degrees apart.

Similarly, three identical magnets spaced 120 degrees apart at the same radial distance and same axial position will also suffice. According to several preferred embodiments of the present invention, identical magnets are placed around a symmetry axis provided that they are at the same radial distance from the axis; they are at the same axial distance; and they are evenly spaced azimuthally. Variations of such preferred embodiments are encompassed by the present invention accordingly to shape the sweet spot as well as to adjust the intensity of the magnetic field at the sweet spot.

Figure 2A:
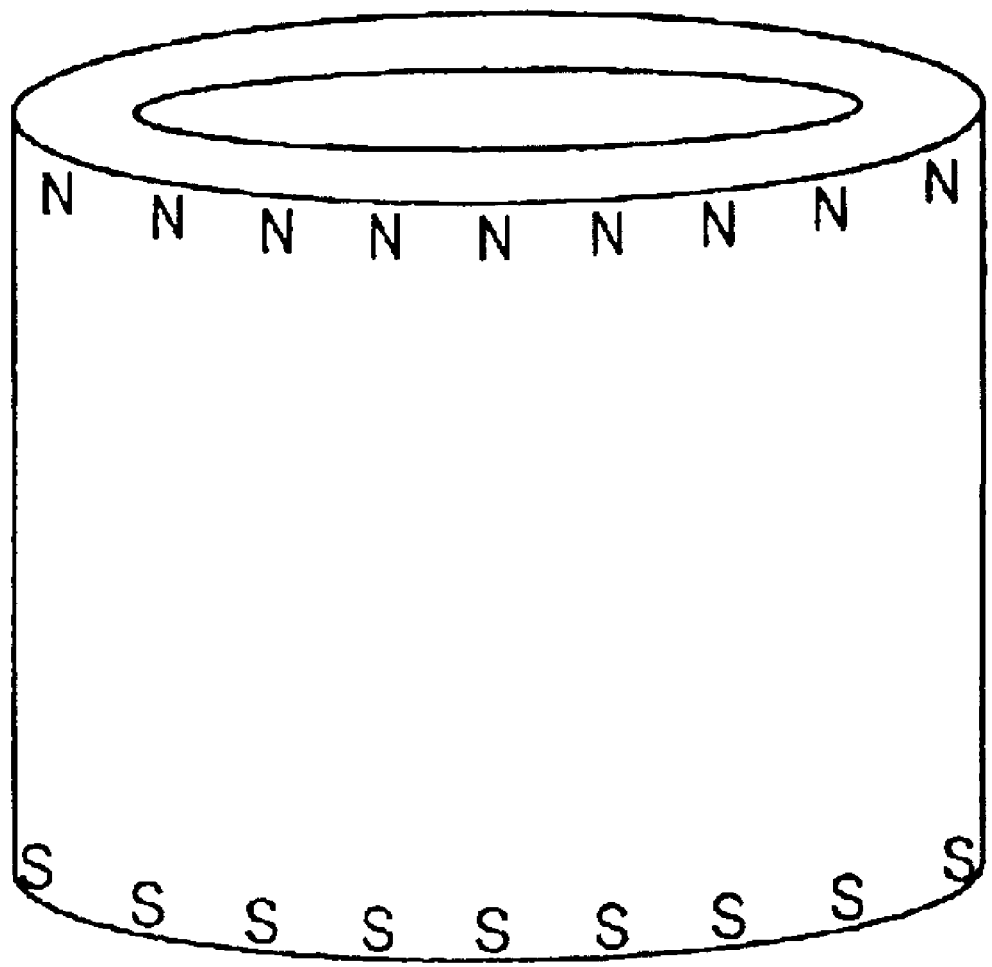
FIG. 2A is a perspective view of a unilateral magnet, showing the cylindrical annular geometry.

In another preferred embodiment of the present invention, a "continuum concept" is applied to the aforementioned geometry such that magnet elements are placed at every location in the region of symmetry around the axis. This particular embodiment comprises a substantially continuous ring of magnetic material. The simplest form of such a magnet comprises a hollow right circular cylinder of magnetic material as shown in FIG. 2A with one end being a north pole and the other end being a south pole. As mentioned previously in a description of a preferred embodiment, the magnet elements do not have to be parallel, straight, or have uniform cross-section. Thus, in a preferred embodiment of a substantially continuous magnet element structure, a 3-dimensional pattern is used with rotational symmetry about an axis, that is, a generalized cylinder. In relaxing the substantially parallel feature, for example, the magnet assembly is conical or is thicker at one end and still substantially symmetrical along the axis. Of course, even more complex magnet assembly shapes are possible while maintaining cylindrical symmetry. Such axially non-symmetric magnet assembly shapes are possible, so long as the assembly generates a substantially uniform magnetic field region at a point removed from the magnet assembly to one side.

In a preferred embodiment of the present invention, a continuous hollow cylinder of magnetic material is used because this geometry has the most magnetic material for the same overall dimension compared to an assembly that uses discrete magnet elements and therefore generates a stronger field than an assembly of discrete magnets. In particular, the longitudinal magnetic field strength of the hollow cylinder is approximately equal to that generated by a discrete assembly of magnet elements, located at the same radial distance as the hollow cylinder, multiplied by the ratio of the material contained in the cylinder to that in the discrete assembly.

Figure 2B:
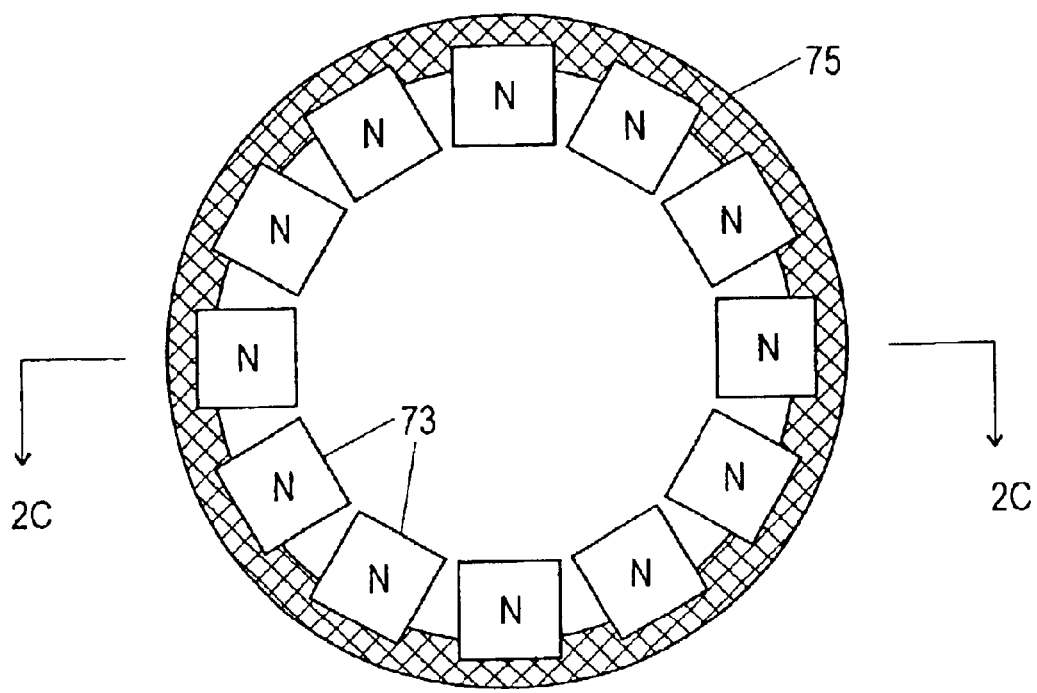
FIG. 2B is a view along the cylindrical axis of a cylindrical annular magnet made from rectilinear magnet blocks showing the columnar structure.
Figure 2C:
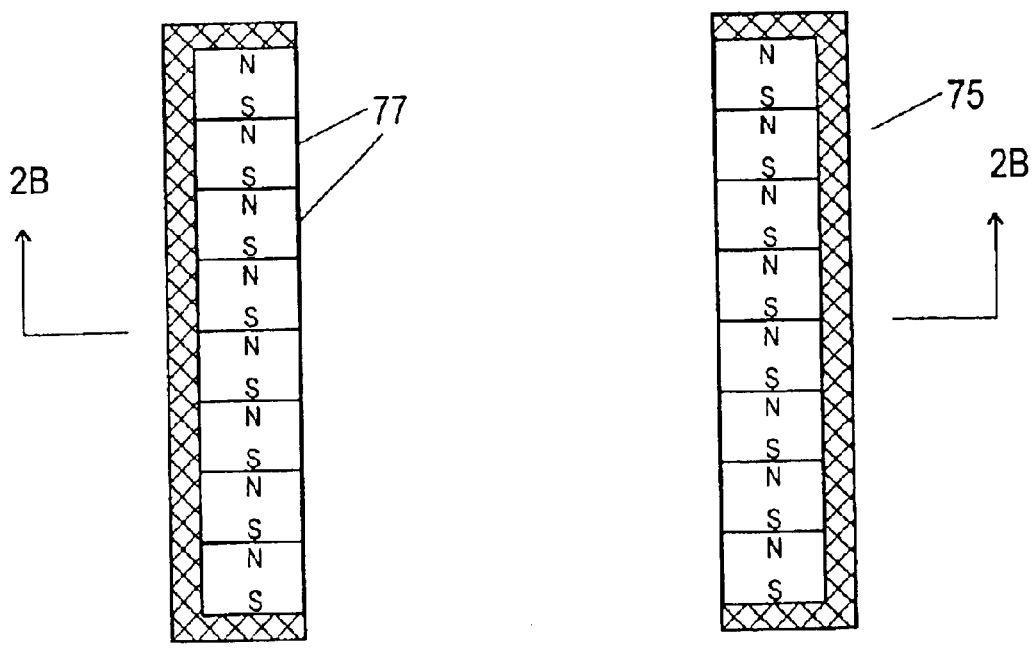
FIG. 2C is a view at right angle to FIG. 2B and containing the centerline, showing the discreet blocks that form the columnar structure.

Considering characteristics of commercially available materials of construction, an assembly built from discrete magnet elements rather than a continuous generalized cylinder is, given available material, preferred because large pieces of permanent magnet material, for example, neodymium iron boron ("NdFeB"), can be difficult to manufacture or magnetize. In considering such limitations of magnetic material an assembly comprising smaller pieces of magnetic material, for example, wedge shaped pieces, are assembled into a suitable geometry. At present, the most readily available geometry for magnetic material is a rectilinear block with either a square or rectangular cross-section. Such block-shaped material of construction is suitable to practice certain preferred embodiments of the present invention. Specifically, non-magnetic forms, for example, made of aluminum, are fabricated and used to hold individual magnet blocks in predetermined positions to satisfy requirements of the aforementioned preferred embodiments. Such non-magnetic forms also serve to contain the strong forces between the magnet blocks. FIG. 2B is a view along the cylindrical axis of a right circular cylinder unilateral magnet showing how rectilinear blocks of magnetic material can be stacked in discrete columns 73 and confined by a non-magnetic form 75. FIG. 2C is a cut orthogonal to FIG. 2B at a diameter through the centers of two columns showing the discrete magnetic blocks 77.

The substantially continuous embodiment of the present invention still allows for suitable interruptions to insert other elements in or through the magnet assembly. For example, in NMR applications, the magnet has to operate in conjunction with a transmit/receive antenna, commonly called the NMR probe and having frequencies in the RF range. In some applications, this antenna occupies the bore of the hollow cylindrical magnet but in other cases this space is insufficient. Therefore, slots or holes are formed in the magnet assembly to permit placement of a suitable antenna. By the same arguments given above, any slots or holes are permissible provided the remaining magnet elements satisfy the design criteria, for example, a center of symmetry maintained at the cylinder axis, be it rotational symmetry or pair-wise reflection symmetry. In a preferred embodiment, holes or slots obey the same criteria; for example, the holes or slots either have pair-wise symmetry or rotation symmetry that corresponds to the number of holes or slots.

Figure 2D:
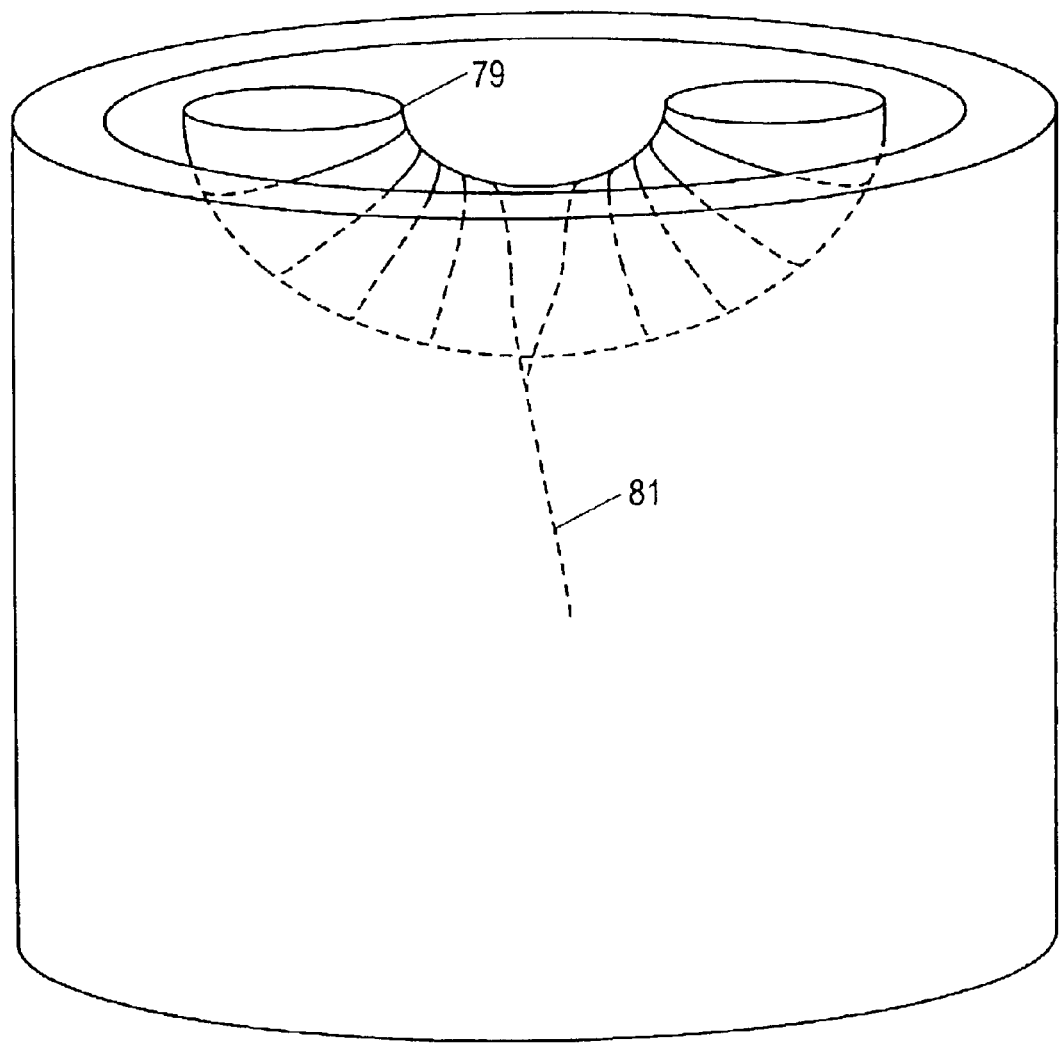
FIG. 2D is a perspective view of a cylindrical annular unilateral magnet with a semi-toroidal antenna coil for NMR.

Antenna coils that are suitable for use with the present invention are selected from amongst several types. One type is referred to as a semi-toroid, as disclosed in U.S. Pat. No. 4,721,914 ("'914 patent"). This antenna comprises one half of a toroidal coil and is, in effect, a solenoidal coil that is bent in an arc that spans 180 degrees. An oscillating electric current passing through the wire of such a semi-toroid generates an oscillating magnetic field that emanates from one end of the semi-toroid and reenters the other end of the semi-toroid. Thus, if a semi-toroid is placed so that its axis of two-fold symmetry is coincident with the cylindrical rotational symmetry of a magnet of a preferred embodiment of the present invention, the magnetic field generated by the semi-toroid will be exactly orthogonal to the field from the magnet on the axis, a situation that gives rise to maximal NMR signals. FIG. 2D is a perspective view of the cylindrical unilateral magnet with such a semi-toroidal antenna coil 79 with the electrical leads 81 going to the NMR circuitry. In another embodiment of the '914 patent, a second semi-toroid coil, rotated 90 degrees from the first semi-toroid about the longitudinal axis of a magnet of the present invention, achieves quadrature operation as described by C. -H. Chen and D. I. Hoult, "Biomedical Magnetic Resonance Technology" (Adam Hilger, Bristol, 1989); pp. 148ff, pp. 200ff. Quadrature operation typically involves generation of rotating magnetic fields and reception of NMR signals via two antennae/coils that are positioned 90 degrees with respect to each other in order to increase the received S/N by a factor of up to 1.4.

Figure 2E:
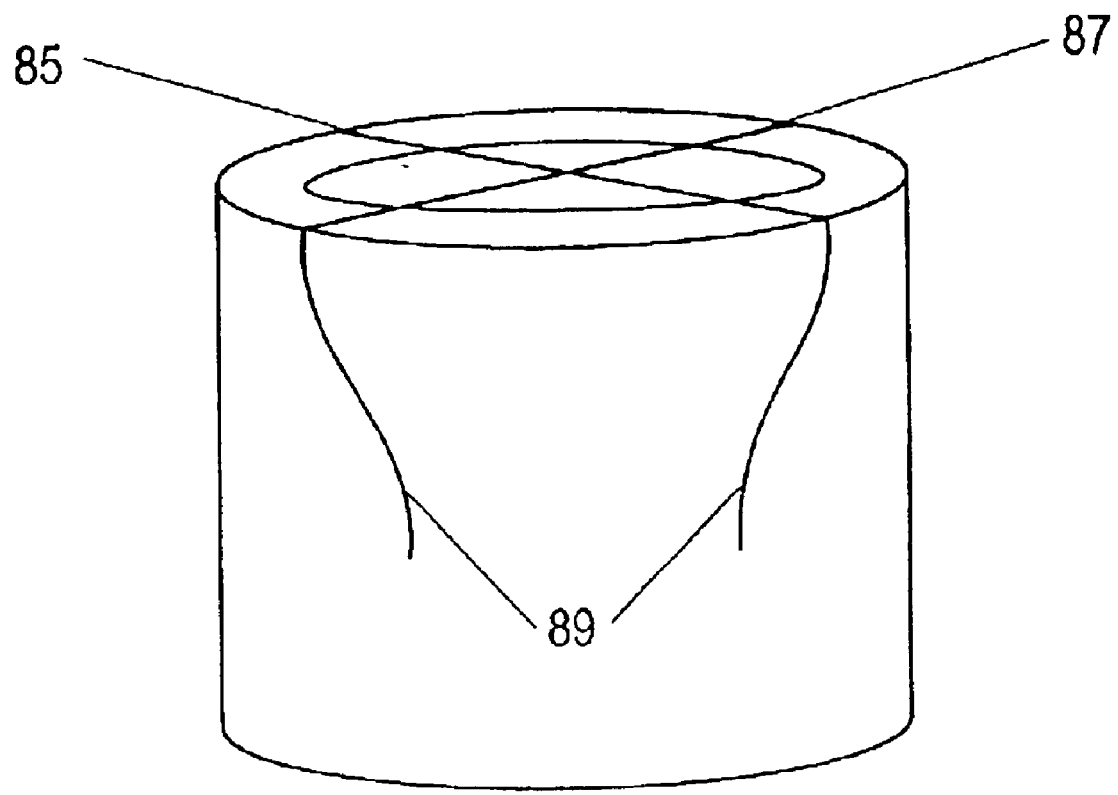
FIG. 2E is a perspective view of a cylindrical annular unilateral magnet with two straight wire antennae orthogonal to each other for quadrature operation of the NMR device utilizing the unilateral magnet.

Another suitable NMR antenna for use with a magnet of the present invention comprises a piece of substantially straight wire across the diameter of the magnet's end-plane. An oscillating electric current in such a wire will generate an oscillating magnetic field extending radially around the wire with cylindrical symmetry barring the presence of other materials that can affect the magnetic field. Thus, at the cylindrical axis of a magnet of the present invention, the field from an antenna is substantially orthogonal to the magnetic field generated by the magnet. Orthogonality between the relatively static field of a magnet of the present invention and a time-varying magnetic field of an antenna is desirable for NMR so these antennas are suitable for use with a magnet of the present invention to conduct NMR along an axis of symmetry. A practical realization of such an antenna that in principle is just a piece of straight wire, is disclosed in U.S. Pat. No. 4,933,638 ("'638 patent"). For purposes of implementing quadrature operation, a second such antenna is positioned along another diametrical line orthogonal to the first antenna. FIG. 2E shows the two straight wire antennae 85, 87, crossing at the center of the magnet's end. The leads 89, once again, connect the coils to the NMR electronics. The aforementioned antenna coil schemes benefit by auxiliary use of suitable ferrites as disclosed in the '638 patent provided that they are shielded from the field generated by the magnet to avoid saturation.

For NMR experiments using the present invention, spatial selectivity of the region of sensitivity is controlled by tailoring the radio frequency field pattern to maximize the signal from the sweet spot. Additionally, the use of two substantially orthogonal antennas, be they semi-toroids, straight wires, or other designs usable in this way, are suitable for further localizing the region of signal excitation and reception. Specifically, if spin-echoes are excited and detected in the sample, it is possible to spatially localize the region from where the NMR signal is received by inducing the echo with excitation of one coil with the first pulse and the other coil with the second pulse. An alternative scheme for localization would be a single-pulse excitation scheme in which the signal is excited with one coil and received with a second, orthogonal coil.

The present invention has numerous applications. In particular, several preferred embodiments serve as a magnet for remote sensing NMR for examination of a region removed some distance from the magnet or the distance from the magnet to the sweet spot.

As a NMR system, the present invention comprises a magnet, antenna coils to transmit energy to and receive energy from a sample located at the region of interest, and other electronic and mechanical devices necessary for NMR signal acquisition and analysis. All of these elements are located remotely from the region of interest. In a preferred embodiment of the present invention, another set of coils, an assembly of magnetic materials, an assembly of iron or other ferromagnetic materials, or a combination of coils and magnetic or ferromagnetic materials are used to create a separate magnetic field that adds to or subtracts from the magnetic field. The additional magnetic field means act to modify the net magnetic field. For example, additional magnetic field means act as gradient magnetic fields for spatially resolving a NMR signal as commonly used in magnetic resonance imaging ("MRI"). Additional magnetic field means also provide means to tailor the extant field so that it will have improved characteristics, for example, to have a larger region of homogeneity or to have a greater homogeneity in a fixed region, including procedures that are commonly referred to as shimming.

When applying the present invention to NMR, as discussed herein, the field strength of the magnet and the frequency f of the excitation are individually or in combination adjustable to satisfy the Larmor equation for the substantially uniform field region. The Larmor equation is $f = \gamma B / 2\pi$ where f is the frequency of the time-varying magnetic field generated by the antenna, B is the strength of the magnetic field generated by the magnet at the sweet spot, and $\gamma$ is the gyromagnetic ratio. In this manner, the uniform field region, or sweet spot, is suitable for NMR experiments.

Figure 3:
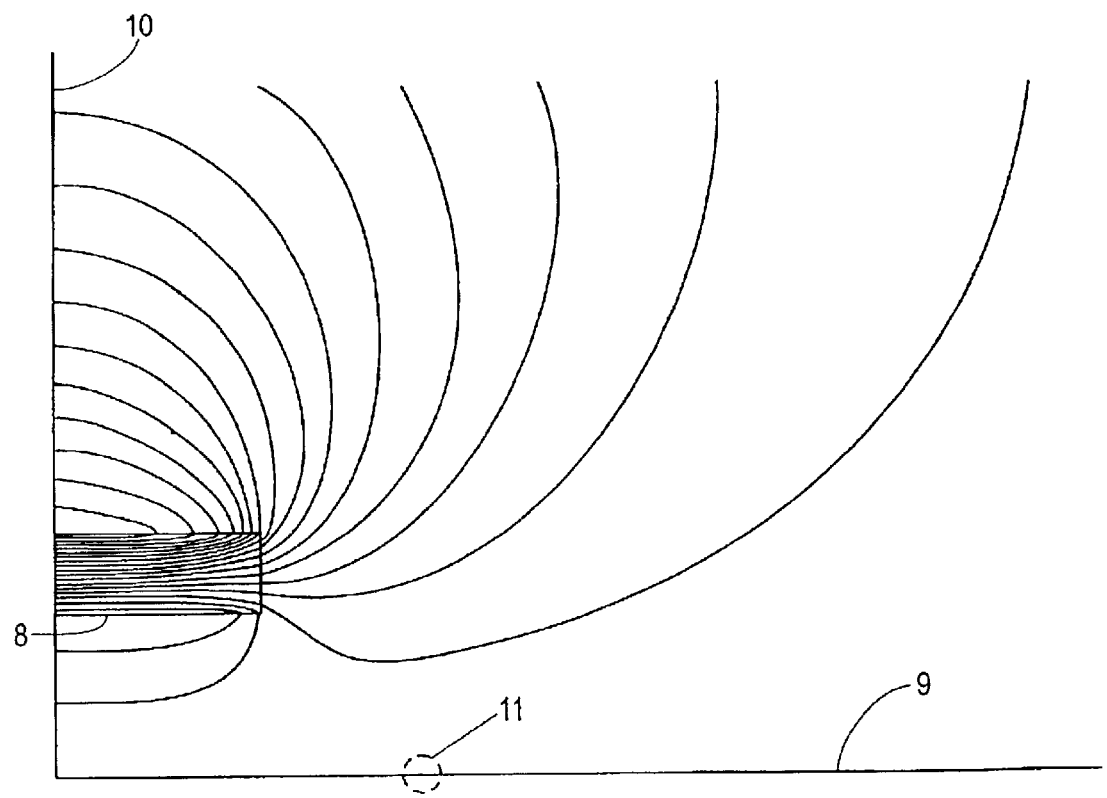
FIG. 3 is a calculated plot of magnetic field lines of a continuous hollow right circular cylinder of NdFeB. Only one quadrant of the whole magnet is shown with the vertical axis at left being a mirror plane and the horizontal axis at the bottom being the axis of cylindrical symmetry.

Geometry and estimations of the relationship between size and location of the sweet spot and the strength of the magnetic field of the present invention were studied through use of field plots calculated for various geometries and different magnetic materials. A typical field plot is shown in FIG. 3. This plot corresponds to a plane containing the cylinder axis of a continuous hollow right circular cylindrical magnet 8, having a mirror plane 10. Only one quadrant of the magnet is shown and the horizontal axis 9 is the axis of cylindrical symmetry. For this example, the hollow tube magnet comprises NdFeB and the length of the half cylinder is 25 cm while its inner and outer radii are 20 cm and 30 cm, a magnet length-to-width aspect ratio of 0.83. Of course, aspect ratios are the primary parameters that describe the present invention rather than absolute lengths. In this particular configuration of the present invention, the field lines converge along the axis at a point that is 44.4 cm from the mirror plane or 19.4 cm past the end of the cylinder. Thus, this particular magnet gives a sweet spot aspect ratio based on distance from end of magnet to width of the magnet of 19.4 cm to 60 cm, or approximately 0.32. NMR performed at the "sweet spot" 11 is in a field strength of approximately 675 Gauss, given the aforementioned magnetic material specifications and absolute dimensions, although this figure depends mostly on the geometrical aspect ratios rather than on the absolute dimensions. For a fixed outer diameter of the magnet, the sweet spot can be moved farther from the magnet by reducing the thickness of the hollow cylinder wall with a concomitant reduction in the magnetic field intensity at the sweet spot. Conversely, the magnetic field intensity is increased by making the wall thicker and moving the sweet spot closer to the magnet.

The description in terms of a hollow right circular cylinder or the presence of a mirror plane 10 is not a limitation of the present invention but rather is presented for facilitating numerical experimentation. For example, as mentioned previously, a preferred embodiment of the present invention comprises a magnet having a conical shell shape that does not have a mirror plane perpendicular to the axis of symmetry.

Figure 4:
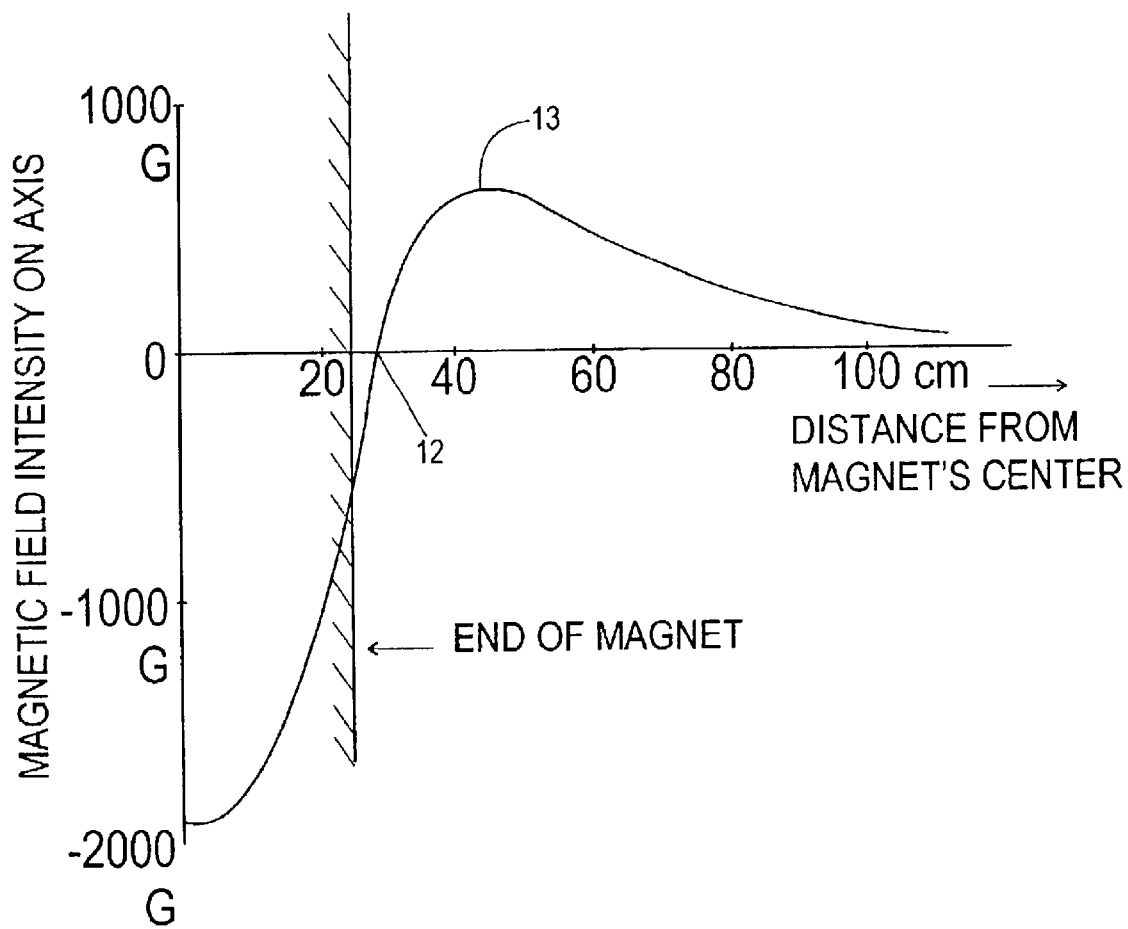
FIG. 4 is calculated magnetic field intensity along the symmetry axis of an arbitrary hollow right circular cylindrical magnet, starting at the center of the magnet. In this example, the hollow magnet ends 25 cm from the center of the magnet and the field direction is negative inside the hollow magnet. The field on axis is identically zero at 29 cm and becomes positive to the right, reaching a relative maximum at 44.5 cm before decaying at greater distances.

FIG. 4 shows the dependence of the magnetic field intensity along a symmetry axis 9 from the field plot calculation as shown in FIG. 3. The magnetic field is a vector and is negative along the cylinder axis within the hollow magnet in going from right to left. The vector reverses direction, going through a null 12 past the end of the magnet. The field, then, increases and reaches a relative maximum 13 at the sweet spot 11 and then decays at greater distances. The relative maximum 13 is a saddle point, where the magnetic field intensity is a maximum in the axial direction but is a minimum in the azimuthal direction, and forms the sweet spot 11 where the field is substantially uniform. For use of this magnet in NMR, the signal is excitable and detectable at this spot.

In a preferred embodiment of the present invention, the distance from the end of a hollow cylindrical magnet to the location of the relative field maximum is positively correlated with the diameter of the annular cylinder for constant annular thickness and length. Therefore, the practice of nesting multiple annular cylinder magnets of the present invention to "tailor" the shape of the region of the relative maximum is useful to substantially increase the size of the sweet spot. In preferred embodiments of the present invention, the flatness of the field profile in the sweet spot along the longitudinal axis 9 is improved by a combination of magnets having sweet spots at different distances so that the combination yields a flatter maximum field region.

Figure 5:
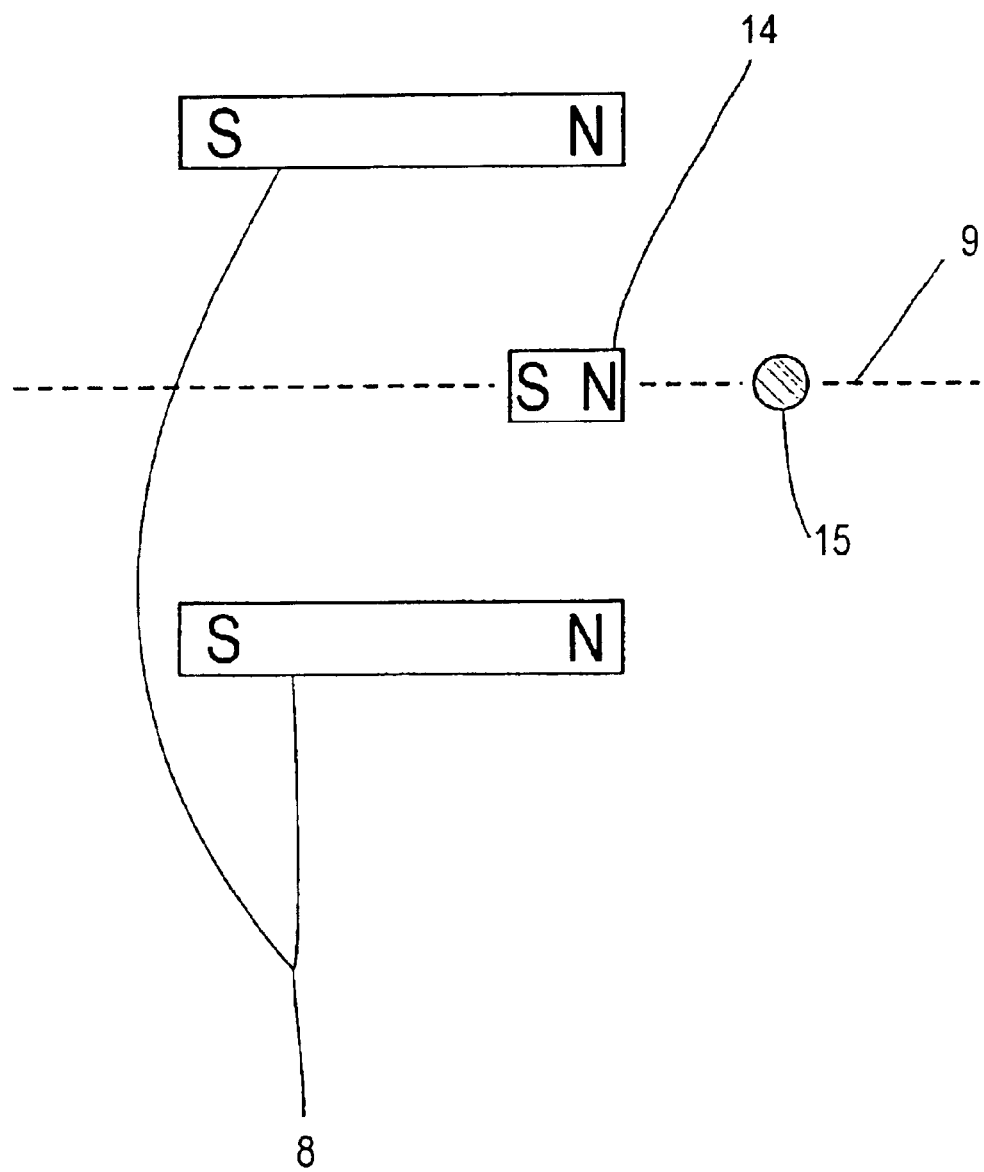
FIG. 5 shows a preferred embodiment of the basic hollow continuous cylinder magnet with an addition of a bar magnet on the cylinder axis. When the polarization of the additional bar magnet is in the same direction as that of the basic magnet, the uniform magnetic field region that is projected away from the end of the magnet assembly is enlarged and the strength of the magnetic field therein is also increased.
Figure 6:
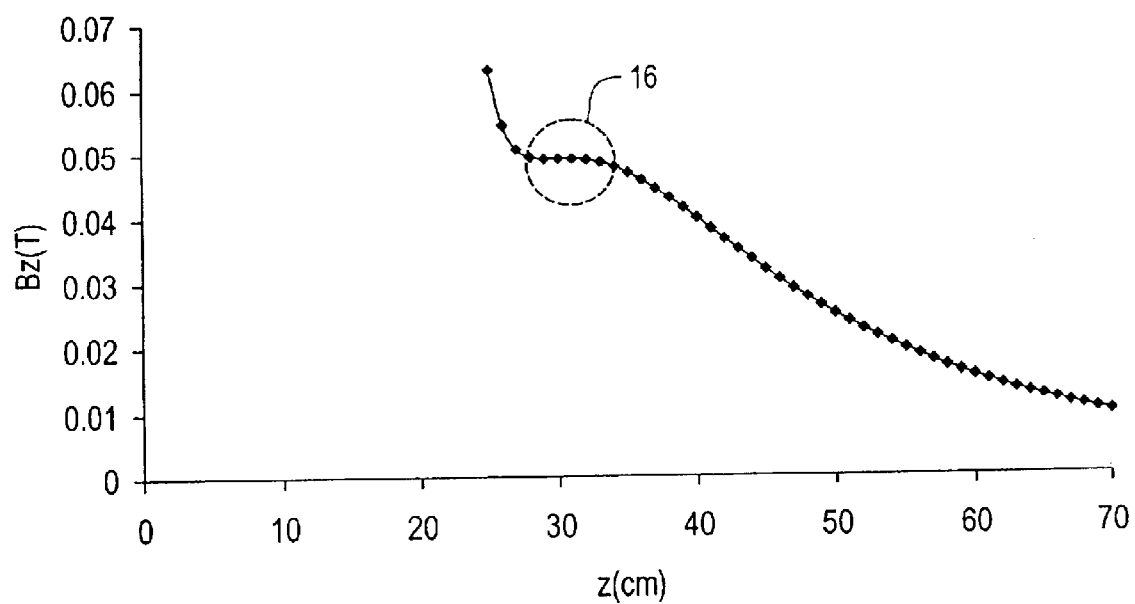
FIG. 6 is a calculated plot of the magnetic field strength on the cylinder axis as a function of distance from the magnet, consisting of a hollow cylinder of magnetic material with an auxiliary bar magnet on the symmetry axis, showing the substantially enlarged region of uniform field at a position remote from the magnet. In this example, the end of the magnet is at 25 cm, the center of the uniform field region is at 31 cm, and the strength of the field is 489 Gauss.

In another preferred embodiment of the present invention, the magnetic field distribution of the basic hollow magnet is tailored by an addition of a cylindrical bar magnet centered on the cylinder axis. The additional bar magnet could have its magnetic polarization oriented either with or against the polarization of the basic magnet. In a preferred embodiment, in which the polarization of the additional bar magnet is in the same direction as that of the basic hollow magnet, the decreasing magnetic field intensity away from the end of the bar magnet substantially compensates the increasing magnetic field intensity of the basic magnet leading up to the maximum 13, to give rise to a substantially enlarged region of magnetic field uniformity. Such an embodiment is shown in FIG. 5 where the additional bar magnet 14 is shown on the cylinder axis 9 but axially positioned asymmetrically with respect to the basic magnet which is shown as a hollow right circular cylinder 8. The addition of the bar magnet 14 in the center of the basic hollow magnet enlarges the region 15 of magnetic field uniformity and increases the strength of the magnetic field therein at the cost of a modest decrease in the distance from the magnet to the region of uniform field. FIG. 6 shows a plot of the computed magnetic field intensity on the cylinder axis 9 as a function of distance away from the end of this magnet assembly embodiment where the geometry and the magnetic property of the magnet material have been adjusted to yield an enlarged region 16 of the magnetic field uniformity.

Figure 7:
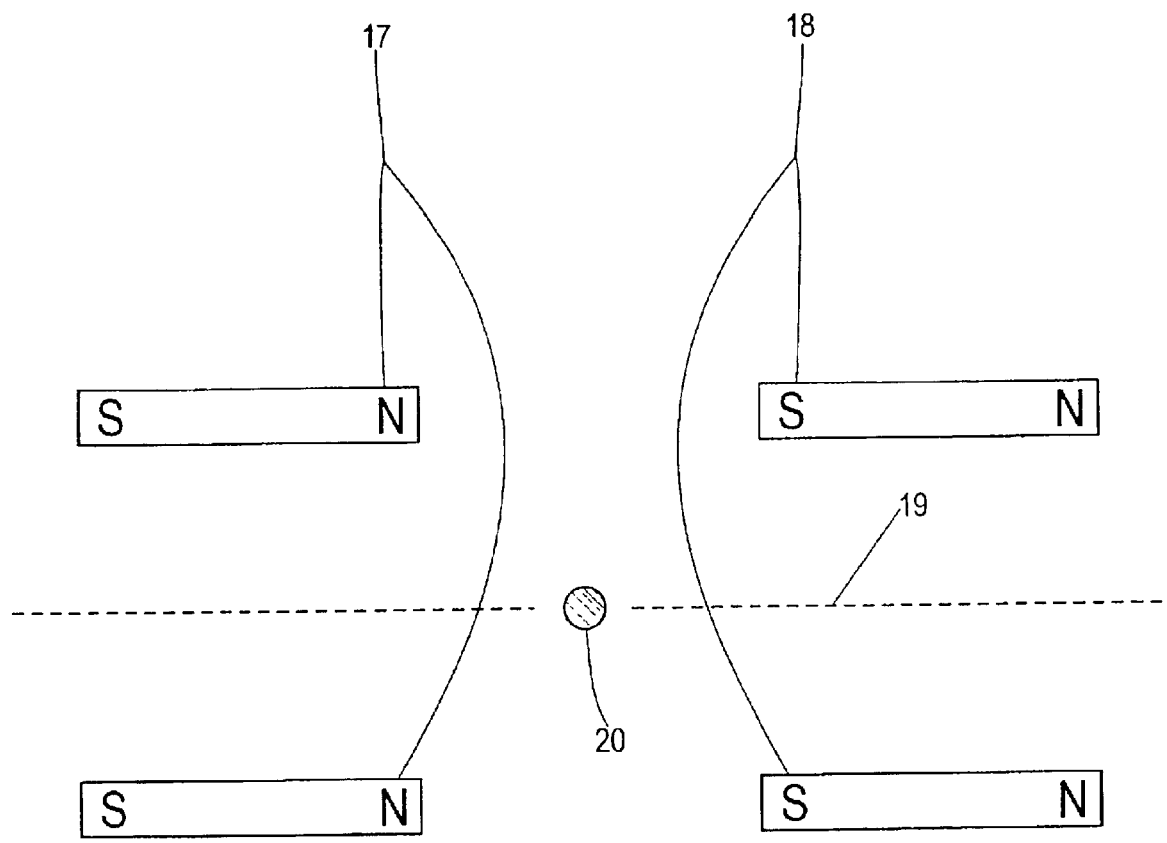
FIG. 7 shows two unilateral magnets having the form of hollow right circular cylinders, paired to create a magnet assembly having an open architecture and resulting in a region of substantially uniform field between the pair.

In yet another preferred embodiment of the present invention, shown in FIG. 7, two unilateral magnets each comprising a hollow right circular cylinder of a magnetic material, are paired to create a magnet having an open architecture, a term applied to magnets being used in medical MRI such as those described in U.S. Pat. No. 5,521,571. Specifically, the two magnets, or magnet assemblies, 17 and 18, are placed on substantially the same axis 19 facing each other with magnetic polarity in the same direction and a separation chosen so that each corresponding uniform field region, or sweet spot location, are preferentially positioned. The term preferentially positioned includes, but is not limited to, fields that are overlapping, adjacent, and separated by a predetermined distance. When the sweet spots are substantially overlapping, this particular preferred embodiment of the present invention generates a substantially uniform field region 20 that is approximately double the field strength compared to a single unilateral magnet assembly. On the other hand, when the sweet spots are slightly displaced from each other so as to be adjacent, the resulting region of magnetic field uniformity is substantially larger, volumetricalty, than it is from a single unilateral magnet assembly while still giving rise to significantly enhanced magnetic field strength compared to a single unilateral magnet.

Figure 8:
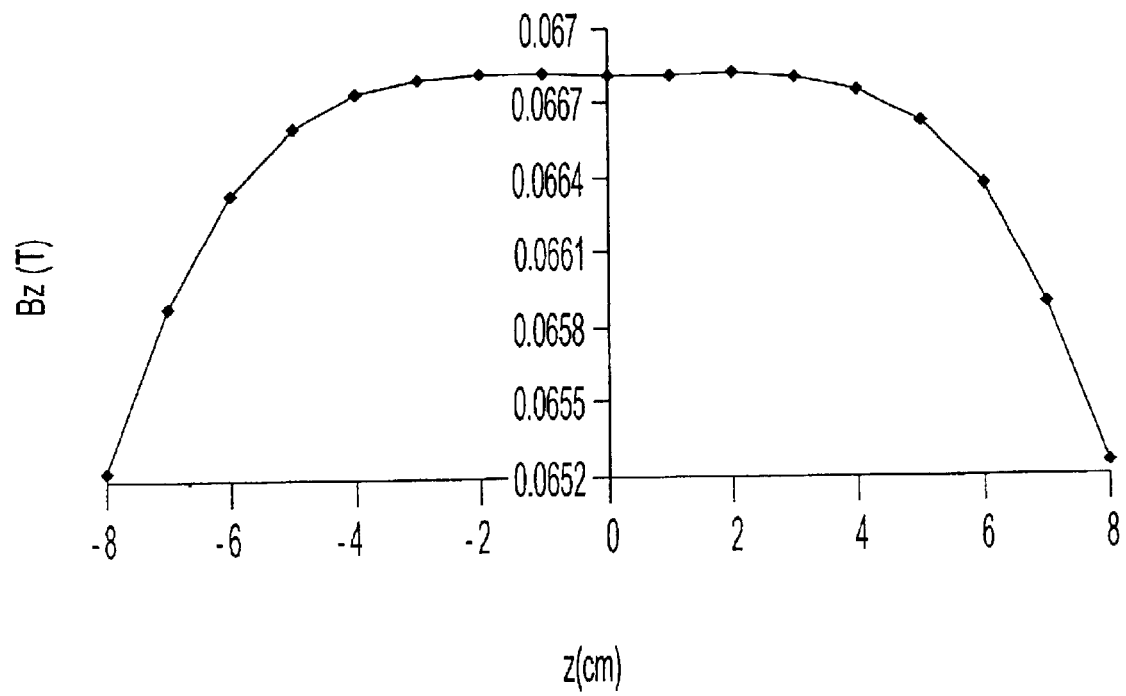
FIG. 8 shows the calculated magnetic field intensity along the symmetry axis between a pair of unilateral magnets as shown in FIG. 7, showing the substantially uniform field region over a significant volume near the center of the open architecture magnet structure.

The aspect ratio of the gap to diameter depends on the exact combination of magnetic materials and geometry. The use of a pair of unilateral magnets of the present invention leads to an open architecture magnet with a gap to diameter ratio that is significantly superior to other open architecture magnets such as those currently commercially available for medical MIU and described, for example, in the '571 patent. FIG. 8 shows the computed axial magnetic field strength near the center of the space between two hollow, right circular NdFeB magnets of the present invention, as shown in FIG. 7. In this example, each cylinder is 25 cm long, 20 cm outer radius, and has 5 cm thick walls and the two units are separated by 46 cm for a gap-to-diameter aspect ratio of 1.15. The magnetic field strength at the sweet spot 20 is approximately 670 gauss and the uniformity of the magnetic field is better than 50 parts per million over a sphere of diameter 4 cm although these calculated parameters are merely examples and do not represent limitations of the invention.

Figure 9:
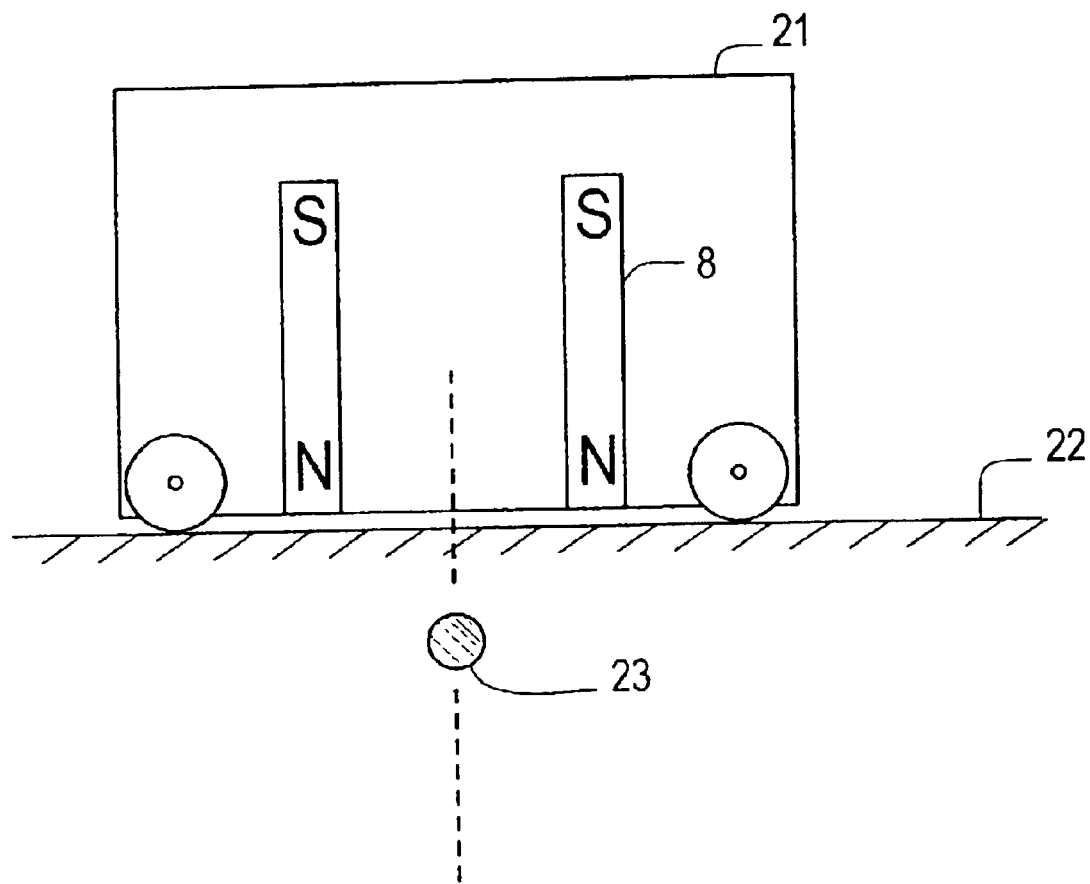
FIG. 9 is a sketch of a mobile remote NMR sensing device for collecting subsurface information, showing the relative positions of the magnet, the ground surface, and the NMR sensitive region.

Magnets of the present invention are suitable for use in a wide variety of operational modes. For example, the present invention is suitable for use as a part of a mobile remote sensing NMR device to detect water content, or information on other nuclei that possess a magnetic moment, below a surface such as the ground or an artificial structure, as shown in FIG. 9. In this case, the entire NMR apparatus 21, containing the hollow cylindrical magnet 8, can be moved along the surface 22 as well as in a vertical direction, to scan the region of NMR sensitivity 23 through the sample. The magnet of the present invention is also fixable to a stationary surface, such as an underside of a table or on one side of a vertical wall, and operational in a manner such that objects of nearly any size are passed by the magnet, for example, by a conveyor belt. Other applications include, but are not limited to, veterinary science especially where an animal may be too large to be placed in the sweet spot of a traditional NMR or MRI system. Of course, the present invention also encompasses an "open architecture" with at least one pair of such magnets, as already mentioned, for examining objects that are small enough to fit through the gap. For such applications, if necessary, at least one of the following is suitable to facilitate operation: conveyor belt, pneumatic or hydraulic transport, gravitational transport or similar transport system.

As already stated, a preferred embodiment of this invention comprises a plurality of permanent magnet elements forming a continuous hollow right circular cylinder. Such a permanent magnet assembly has the basic simplicity of not requiring a power supply and attendant electrical current, cooling water, or cryogenic liquids with an insulating dewar. Alternatively, a plurality of resistive steel electromagnets forming a continuous hollow right circular cylinder or even air-core magnets made from either resistive windings or superconducting windings having the same geometry form the basis for additional embodiments of the present invention.

A plurality of electromagnets suitable for alternative embodiments of the present invention generates a magnetic field pattern having a sweet spot similar or same as that of aforementioned preferred embodiments with permanent magnets. All permanent magnet elements mentioned in this disclosure can be replaced by equivalent electromagnets with similar results. An electromagnet that is fully analogous to the permanent magnet embodiment discussed so far consists of a right circular hollow cylinder made of steel or other similar ferromagnetic material with azimuthal coils of wire providing electric currents in opposite directions on the outer and inner surfaces, respectively, of the hollow cylinder. An easier alternative embodiment of a steel or other ferromagnetic magnet with a uniform current density on only its outer surface has a magnetic field inside the bore that is not reversed from the magnetic field direction along the rest of the axis 9 in contrast to the hollow right circular permanent magnet cylinder as seen in FIG. 4. The distance from the end of the magnet to the region of substantially uniform field for this iron electromagnet embodiment is less than the distance to the region of substantially uniform field for a NdFeB magnet with the same geometry and magnetic field intensity at the sweet spot. These examples are shown in FIG. 10, where magnetic field strength, plotted along a common cylinder axis, is shown for two identical magnet geometries.

Figure 10:
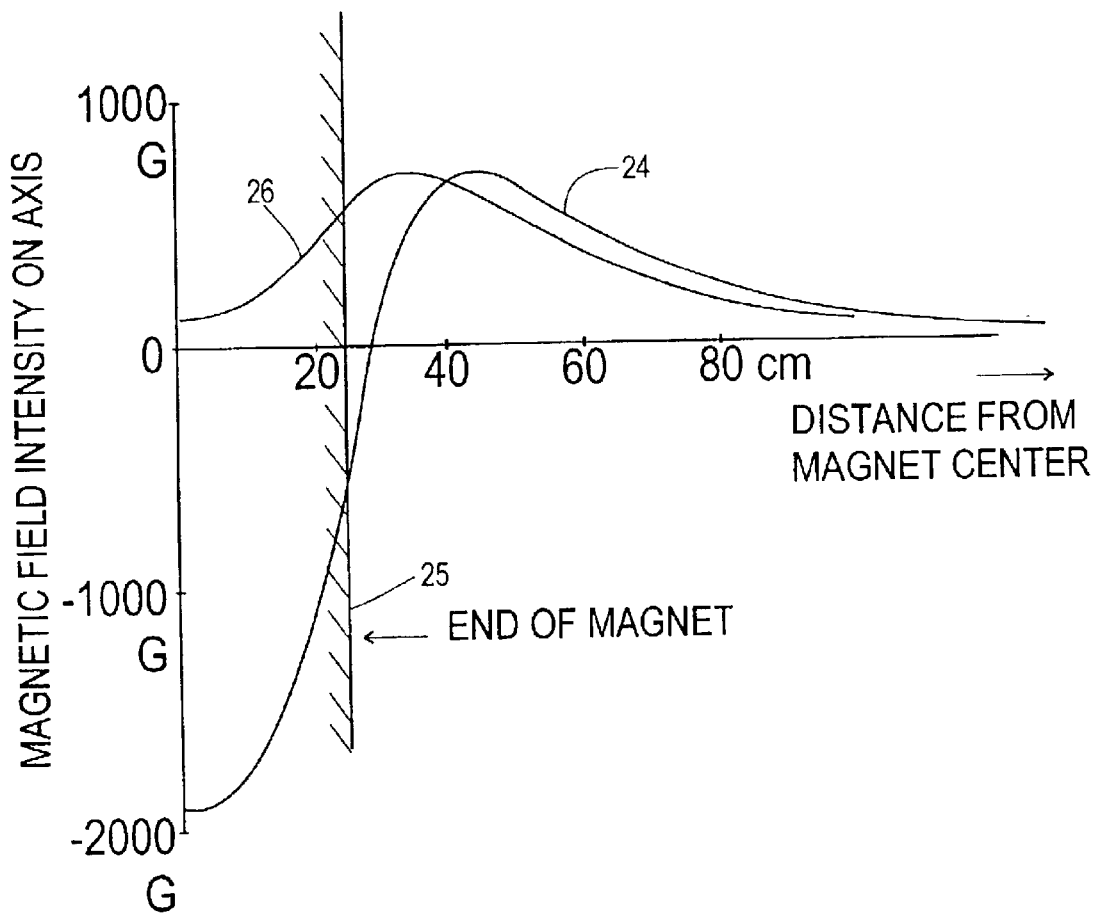
FIG. 10 is a calculated plot comparing the magnetic field strengths along the symmetry axis of the hollow right circular cylindrical magnet made of two different materials, NdFeB and steel with a uniform azimuthal current density on the outer surfaces to generate comparable magnetic field strengths at the sweet spot.

FIG. 10 compares performances of two embodiments of the present invention. One magnet is made of NdFeB while the other is made of steel with uniform electrical current around the hollow cylinder of steel to produce the same field strength at the sweet spot. The curve for the NdFeB hollow magnet 24 is identical to the curve of FIG. 4. The curve is negative within the magnet cylinder, changes sign past the end of the magnet 25 at 25 cm, and reaches a relative maximum of 675 Gauss at a displacement of 44.4 cm from the origin or 19.4 cm from the end of the magnet 25. On the other hand, the curve for the electromagnet 26 is always positive and reaches a maximum of 675 Gauss at a distance of 35 cm from the origin or 10 cm from the end of the magnet 25. Thus, in this example, the distance from the magnet to the sweet spot is a factor of 1.94 better for the preferred embodiment with permanent magnets compared to the electromagnet embodiment. Nevertheless, electromagnets offer certain advantages over permanent magnets as enumerated below.

Air-core electromagnets are inefficient because they lack the iron core to take advantage of the enhanced permeability of iron. However, this inefficiency is overcome with the use of uperconducting windings that carry a very large current without significant power dissipation. Present day superconductors need to operate at cryogenic temperatures so a dewar that thermally insulates a cold coil from warm ambient atmosphere is necessary. The dewar must be located between the coil and the object to be studied, so such a layer of thermal insulation may occupy a significant fraction of the space between the coil and the sample, reducing the practical aspect ratio of distance to the sweet spot to the overall cross-section of the magnet.

Electromagnets have the virtue that the current generating the magnetic field can be varied with ease. One ramification that follows is that the intensity of the magnetic field at the sweet spot can be changed at will. A second virtue is the ease in turning off the magnet, in case there is a need to do so, as in an emergency situation.

Figure 11:
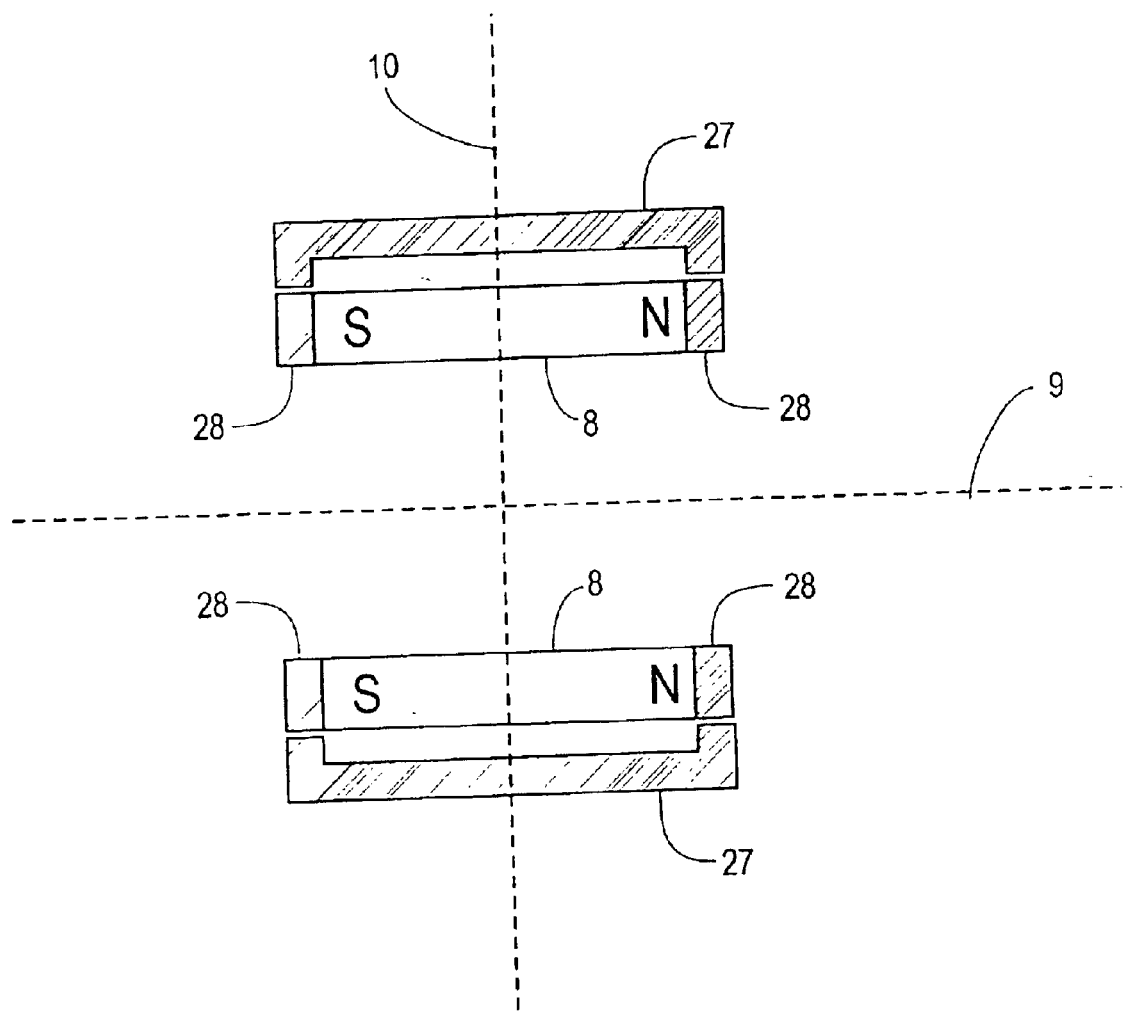
FIG. 11 is an illustration of a steel magnetic short and its relation to the hollow right circular cylinder magnet with steel end-caps. In the position shown, the short will carry most of the magnetic field lines from one pole to the other, thus removing them from outside the magnet. It can be moved away from the magnet by a mechanical device like a hydraulic winch, in order to turn on the magnetic field.

Even though a permanent magnet cannot be turned off with a switch like the electromagnet, the magnetic field of a permanent magnet assembly is shortable by a steel, or similar ferromagnetic metal, placed in close contact with the magnet's two poles. Implementation of such a short is facilitated through use of steel end-caps that improve the magnetic contact between the steel short and the magnet ends. In addition, such steel end caps enhance the azimuthal homogeneity of the magnet, especially if the magnet assembly consists of discrete blocks of magnetic material or otherwise has some inhomogeneities due to imperfections in the magnetic materials or due to the existence of slots or holes as described earlier. FIG. 11 shows a realization of a cylindrical steel short 27 on the outside of the cylindrical magnet 8, together with the steel end caps 28, showing the relationship between the end caps and the short. FIG. 11 shows the longitudinal cross-section of an entire hollow cylindrical magnet assembly containing the axis of cylindrical symmetry 9 and having a mirror plane 10, instead of just one quadrant as was done in FIG. 3. Because of the large magnetic permeability of the steel, the magnetic field lines return from one pole to the other through the steel, in preference to through the air, thus reducing or nearly eliminating the magnetic field away from the magnet. Of course, the magnetic short 27 shown on the outside of the magnet in FIG. 11 is alternatively built inside the hollow magnet when sufficient space exists and is feasible from both the point of view of logistics as well as of flux-carrying capacity.

The present invention projects a magnetic field to create a region of uniform field of a elected tolerance at some distance away from the end of the magnet structure. According to the present invention, the distance between the uniform field region and the magnet structure is affected by the magnet's dimensions and materials of construction. For example, the overall diameter of the hollow cylinder magnet as well as the length and cross-sectional area of the magnet are parameters that affect the location of the sweet spot. The strength of the magnetic field of the present invention depends on several factors including materials of construction. A magnetic field strength on the order of a few to several hundred Gauss is attainable at a distance of the order of the radius of the magnet using modern magnetic material such as neodymium iron boron (NdFeB). Although hollow cylinder magnets of the order of a fraction of a meter to a few meters in overall size are presented within this disclosure, the strength of the magnetic field at the sweet spot is approximately independent of the absolute scale of the magnets. The larger units have sweet spots that are farther but with substantially similar magnetic field strengths, corresponding to the overall size of the magnet for a similar aspect ratio. The larger units have more magnetic material by an appropriate amount to compensate for the larger distances.

The basic remote sensing NMR unit, comprising a magnet of the present invention and necessary coils and other NMR accessories, is either fixed or mobile. Two-dimensional spatial distribution of materials such as water can be measured by moving the sweet spot around. Subsurface water, for example, is mapped by moving such a remote sensing NMR apparatus around on the ground. The depth information is obtained, to first order, by lifting the entire apparatus with a mechanical or hydraulic arrangement. Other applications include tracking nuclei having magnetic moments over time and space. Such information is useful for determining diffusion and fluid flow properties of materials of interest and surrounding media.

Alternatively, it is possible to move the distance to the sweet spot without having to move the entire apparatus. One method is to mechanically rearrange parts of the multicomponent permanent magnet assembly. Such components are either of other magnetic material, such as additional solid or hollow cylinders that fit inside or outside the basic hollow tube magnet or pieces of ferromagnetic material such as steel. An equivalent method is to make the magnet assembly as an electromagnet and vary the currents that magnetize the various parts of the assembly. It is also possible to change the magnetic field profile by arranging blocks of steel or magnetic material as is presently done with some shimming schemes for NMR magnets. Finally, these methods for changing the position of the sweet spot are also suitable for changing the strength of the magnetic field at the sweet spot.

In the present invention, the location of the sweet spot depends on several factors as previously discussed; however, a practical sweet spot is attainable at a distance up to, for example, approximately 50% of the cross-sectional dimension of the magnet. Magnets of the present invention are usable in NMR, an application encompassed by several embodiments of the present invention. In one of the embodiments, a magnet is used together with a semi-toroidal coil as described in U.S. Pat. No. 4,590,427. In another embodiment of the present invention, a magnet is used together with a linear coil, possibly containing ferrite material, as described in U.S. Pat. No. 4,933,638. In, yet, different embodiments, pairs of coils such as the semi-toroid or the straight wire are used at approximately right angles to each other for quadrature operation. In a further embodiment for a NMR application, an open-architecture design is used wherein two magnet assemblies are positioned collinearly but facing each other with their magnetic fields oriented in the same direction. In one specific embodiment, the two assemblies form an open structure magnet assembly with an aspect ratio, e.g., the gap-to-diameter ratio, of approximately one.

Because the present invention projects a sweet spot of uniform field at a point that is distant from the magnet in a specific direction, it is qualitatively different from those magnets that do not generate a significant region of uniform magnetic field such as some of the magnets of King, et al. (1975), of Eidmann, et al. (1996), and most of the apparatuses designed to work in cylindrical holes such as, but not limited to, the '713 patent, '877 patent, and '878 patent. The present invention also differs from those inventions intended to work from inside bore holes or vessels ('955, '876, and '132 patents) that project a substantially uniform magnetic field in radial directions, because the present invention comprises a device that projects a uniform field region to one side of the apparatus. Finally, the present invention is an improvement over all other unilateral magnets that project a region of substantially uniform field in a certain direction because of the superior aspect ratio based on the distance of the region of uniform field projected from the magnet to the cross-section dimension of the magnet.

The '638 and '788 patents generate a region of substantially uniform field to one side of a borehole from the magnet that is inside the bore-hole. As already mentioned, this is accomplished with two or three slab-shaped magnets in a manner somewhat similar to the previous illustrative example with two bar magnets, shown in FIG. 2. However, these patents deal with downhole tools that fit into a bore-hole and the slab-shaped pieces of magnetic material, extending in the bore-hole direction, gives it the requisite sensitivity by extending the region of uniform field in the direction of the bore-hole, and still to one side of the bore-hole. The present invention takes a different approach to the manner in which the magnet elements are extended; instead of extending the magnet elements in a linear direction that is perpendicular to the direction of the sweet spot with a concomitant enlargement of the region of substantially uniform field, the elements are extended in a circular pattern around the axis that points to the sweet spot without enlarging the sweet spot. In this way, the present invention generates a much stronger magnetic field in the sweet spot than the '638 and '788 patents.

Thus, the present invention is a structurally simple embodiment comprising three or more shorter bar-shaped magnets with a common axis of rotational symmetry, defining a longitudinal axis along which the sweet spot is located. In this embodiment, the three bar-shaped magnets are spaced at 120 degree intervals about the longitudinal axis and project a sweet spot on the longitudinal axis that is at some distance from the magnet assembly with the field pointing only in the axial direction. In the preferred embodiment, the geometry of the magnet will be a hollow right circular cylinder, being a limiting continuous form of an increasing plurality of such magnet elements or pairs, with one end polarized north and the other end south. In this way, a stronger field is produced by this embodiment of the present invention at the region of substantially uniform magnetic field than by a combination of two or three slabs constituting the magnet elements in the '638 and 788 Patents. On the other hand, in the '638 and '788 patents, the magnet elements can generate a region of substantially uniform field that is weaker but longer in the dimension that corresponds to the bore-hole direction in the present invention, a plurality of magnets are located at substantially the same radial distance from an axis of symmetry and positioned so that the axis represents a center of symmetry. For example, when two additional magnets, 180 degrees apart, are added, the additional pair of magnets can be positioned approximately 90 degrees with respect to the first two magnets around the longitudinal axis of symmetry. In fact, any angle rotation of the second pair suffices. Again, the geometry of the slab-shaped magnets of the '638 and '788 patents are dictated by the intended use of the device in a bore-hole and such a design does not allow for any significant degree of deviation from the parallel arrangement of the slabs that are collinear to the bore-hole.

The '427 patent by Fukushima, et al., differs from the present invention in several ways. First and foremost, the principle used to null the first three derivatives of the axial magnetic field in the '427 patent makes this invention unique; no other patent considered in this application duplicates this principle. However, the principle that led to the unique magnetic field uniformity also puts a rigid restriction on the relative position of the sweet spot at a distance equal to approximately ½ of the radius of the smaller loop of wire from the magnet. A typical size of the smaller loop of wire is approximately ½ of the larger loop so, for this case, the distance to the sweet spot from the unilateral magnet of '427 patent is of the order of % of the radius of the larger loop. In a specific example of a magnet having two loops of diameters 2 meters and 1 meter, the sweet spot will be 25 cm from the smaller loop, resulting in an aspect ratio of distance to the sweet spot compared to the magnet's diameter of 0.125. If the thickness of the thermally insulating dewar needed for superconducting operation is taken to be 10 cm, the overall diameter of the magnet will be 2.2 meters and the distance to the sweet spot from the outer surface of the dewar will be 15 cm so the aspect ratio of the two numbers, that is, the distance to the sweet spot divided by the magnet's diameter, is reduced further to 15/220. In contrast, the present invention can have a sweet spot at a distance approximately equal to the radius of the magnet and there is no thermal insulation to modify this figure. Thus, for a 2 meter diameter magnet, the aspect ratio is approximately %2 or a factor of 4 to 7 better than the magnet of the '427 patent. Second, the realization of '427 patent requires use of cryogens and electrical power both of which complicate the operation of the magnet compared to the permanent magnet embodiment of the present invention especially for use of the device outdoors. Finally, the magnet of '427 patent, being made of wires carrying electrical currents in the absence of any magnetic materials, is not well-suited to producing strong magnetic field unless it is made from coils of superconducting wires that can carry large amount of current. This, in turn, requires the use of a dewar to thermally isolate the coils that are at cryogenic temperature from ambient temperature and drastically reduces the space available between the magnet assembly and the sample.

The '271 patent by Ohkawa discloses a NMR device with a specially designed magnet. This magnet is substantially different from the present invention because it projects a generally toroidal zone of substantially uniform magnetic field that is azimuthally symmetric and pointing in the radial direction. Thus, this device is more like the bore-hole devices but designed to be used as a unilateral, or directed device. The region of substantially uniform magnetic field is spread out over the toroid so the magnetic field intensity in any particular direction is not as strong as in the present invention.

The '904 patent by Pissanetzky discloses an electromagnet that projects a substantially uniform magnetic field region away from a large plurality of coils with currents in opposite directions. The magnet in the '904 patent is a complex device with a large plurality of coils and different currents requiring moderately complex electronic power supplies as well as cryogen needs. Therefore, the same remarks, above, on the cryogen and electric power needs for this device applies so the present invention is much preferable from that standpoint. A major difference between the '904 patent and the present invention is that the aspect ratio of the present invention is much larger compared to the '904 patent. A typical embodiment of the '904 patent, as slated earlier, has a projection distance of 15 cm for a magnet having a diameter of 125 cm. If, once again, the dewar thickness is taken to be 10 cm, the aspect ratio will be 5/145 which is smaller than even the magnet of patent '427 and much smaller than the nominally % of the present invention.

The '960 patent by Pulyer is another remote magnet with a substantially uniform field away from the magnet surface, combined with a set of coils that generate linear magnetic field gradients at the site of substantially uniform field for magnetic resonance imaging. Once again, this device has a large plurality of coils and different currents requiring moderately complex electronic power supplies as well as cryogens so the remarks, made above in connection with the '904 patent on the cryogen and electric power needs, applies. Furthermore, no aspect ratio close to the value of ½ for the present invention is disclosed in the '960 patent. In fact, FIG. 3b in the '960 patent suggests an aspect ratio that is of the order of 15/220 which is a factor of 7 worse than the present invention.

INDUSTRIAL APPLICABILITY

An application of the invention according to the present invention uses an embodiment of the present invention having the cylindrical, (e.g., directional) axis horizontal and located behind a glove-box of the type used to handle reactive, radioactive, or toxic materials. Alternatively, the magnet is mounted under the glove box so the uniform field region is projected up into the glove box. The magnet is positioned in a manner that a region of relatively uniform magnetic field exists inside the box. A semitoroidal NMR coil ('427 patent) or any other equivalent probe may be located inside the glove-box where it may scan the sample that is located in the sweet spot. The detector coil may be fixed in space so that the sample may be moved past it or, conversely, it may be a hand-held unit than can be brought proximally to the sample, which is already located in the sweet spot. In this way it is possible to analyze a reactive, radioactive, or toxic sample, for example, for concentration of hydrogen or other nuclei having a magnetic moment, without taking the sample out of the protective glove-box, which in a sense acts as a protective partition.

A second application of the present invention is as a super-open architecture interventional magnet for clinical MRI. The current state of medical MRI uses "open architecture" magnets consisting of two massive rings in which the patient lies along the cylinder axis and the intervention is performed by a physician standing in a relatively narrow gap between the two rings. The present invention offers an alternative that is far more open with a distance to the sweet spot relatively greater than it is for any previously described device.

Another application of the present invention detects water, or other liquids having nuclei that possess magnetic moments, below ground surface. At present, remote NMR detection schemes exist for either looking very close to the surface with centimeter resolution, such as the Southwest Research devices already mentioned, or looking very deep with horizontal resolution on the order of 50 meters, such as with the Semenov device already mentioned. The large-scale experiment of Semenov in Earth's field is not amenable to scaling down because of the sheer number of atoms and the large volume needed to yield adequate signal strength. Simply making larger versions of existing magnet designs is also impractical due to limitations as to size, weight, and power requirement (for a powered resistive magnet) because the state of art remote magnets project their usable field region only a relatively short distance compared to the overall size of the magnet, in other words, such systems have a small aspect ratio. Therefore, extending the near-surface methods outward is possible only with a newly designed magnet such as the present invention to generate a static field that is large compared to the Earth's field at distances of few to several meters.

A self-contained remote-sensing NMR apparatus, made with a magnet of the present invention, can be used to detect relatively shallow subsurface water or other fluids. The magnet of the present invention generates a static field within the volume of interest and a remote NMR coil, integrated with the magnet, obtains the signal from a specific spot below the assembly. The entire assembly is mountable on wheels, or other transportation means, for easy transport on, for example, airport taxiway and runway surfaces. In this way, the sweet spot can be scanned through the material to generate a map of the desired component, for example, water. In addition, vertical profiles are obtainable by mechanically raising the assembly from the surface by adjusting features of the magnet, or through electromagnetic means.

Overall, NMR apparatuses of the present invention are suitable for use in a variety of fields, including, but not limited to, physics, chemistry, mechanical engineering, civil engineering, nuclear engineering, petroleum engineering, food processing, pharmaceutical production, biology, forestry, veterinary science and medicine. For instance, consider forestry where apparatuses and methods of the present invention are suitable for measuring properties of trees in situ, including, but not limited to, water content and water movement. Thus, the present invention expands the range of NMR applications and makes many of those uses practical.

The preceding examples can be repeated with similar success by substituting the generically or specifically described features and/or operating conditions of this invention for those used in the preceding examples.

Although the invention has been described in detail with particular reference to these preferred embodiments and examples for its use, other embodiments can achieve the same results and the examples are not taken to imply any limitations thereto. Variations and modifications of the present invention will be obvious to those skilled in the art and H is intended to cover in the appended claims all such modifications and equivalents. The entire disclosures of all references, applications, patents, and publications cited above are hereby incorporated by reference.

What is claimed is:

1. A magnetic field generating apparatus with applications to magnetic resonance, comprising two identical bodies each said bodies comprising at least two coaxial bodies, said coaxial bodies comprising:

annular and cylindrical cross-sections each having at least one diameter and all having a common longitudinal axis;

finite lengths; and magnet systems for producing at least one substantially uniform magnetic field in a region external to said bodies and centered on said longitudinal axis wherein said substantially uniform field region is located between said two bodies and said two bodies are separated by a distance of at least 0.30 times a largest of said diameters.

2. The apparatus of claim 1 wherein said magnet system comprises at least one member selected from the group consisting of electronic magnets and permanent magnets.

3. The apparatus of claim 1 comprising means for moving at least one identical pair of said concentric bodies relative to another of said concentric bodies.

4. The apparatus of claim 1 wherein at least one of said magnet systems comprises an electronic magnet and current adjustment means for adjusting current of said at least one electronic magnet system.

5. The apparatus of claim 1 comprising at least one antenna for producing at least one magnetic field approximately transverse to said uniform magnetic field wherein said at least one magnetic field is selected from the group consisting of rotating magnetic field and oscillating magnetic field.

* * * * *